US006587004B2

United States Patent
Ide

(10) Patent No.: US 6,587,004 B2
(45) Date of Patent: Jul. 1, 2003

(54) SIGNAL AMPLIFIER AND OPTICAL SIGNAL RECEIVER USING THE SAME

(75) Inventor: Satoshi Ide, Kawasaki (JP)

(73) Assignee: Fujitsu Limited, Kawasaka (JP)

(*) Notice: Subject to any disclaimer, the term of this patent is extended or adjusted under 35 U.S.C. 154(b) by 0 days.

(21) Appl. No.: 10/171,559

(22) Filed: Jun. 12, 2002

(65) Prior Publication Data

US 2002/0153958 A1 Oct. 24, 2002

Related U.S. Application Data

(63) Continuation of application No. PCT/JP99/07376, filed on Dec. 27, 1999.

(51) Int. Cl.[7] .................................................. H03F 3/08
(52) U.S. Cl. .................................. 330/308; 250/214 A
(58) Field of Search ................................. 330/308, 110, 330/69; 250/214 A, 214 AG; 327/309

(56) References Cited

U.S. PATENT DOCUMENTS

| 5,612,810 A | * | 3/1997 | Inami et al. ............ 250/214 A |
| 5,777,507 A | | 7/1998 | Kaminishi et al. |
| 5,892,609 A | * | 4/1999 | Saruwatari .................. 330/308 |
| 5,923,219 A | | 7/1999 | Ide et al. |
| 6,018,407 A | * | 1/2000 | Hatakeyama et al. ....... 327/309 |
| 6,151,150 A | * | 11/2000 | Kikuchi ..................... 359/194 |

FOREIGN PATENT DOCUMENTS

| EP | 0 735 707 A2 | 10/1996 |
| JP | 3-266577 | 11/1991 |
| JP | 8-18429 | 1/1996 |
| JP | 8-84160 | 3/1996 |
| JP | 8-331064 | 12/1996 |
| JP | 10-261940 | 9/1998 |

* cited by examiner

Primary Examiner—Robert Pascal
Assistant Examiner—Khanh Van Nguyen
(74) Attorney, Agent, or Firm—Katten Muchin Zavis Rosenman

(57) ABSTRACT

To provide configuration of a signal amplifier and an optical signal receiver using the same, enabling to solve a problem of waveform deterioration being produced by external noise, etc. in the signal amplifier of the optical signal receiver. The optical signal receiver includes a first master-slave level detector for detecting a DC level of a normal phase signal, and a second master-slave level detector for detecting a DC level of an inverse phase signal. By adding alternated signal components respectively, a differential signal transmission is enabled. Accordingly, using two master-slave level detector having mutually symmetric configurations and thus enabling differential transmission, there can be obtained a signal amplifier which can cope with various transient responses produced at the top of a burst cell and is sufficiently protected against the disturbance produced by external noises.

18 Claims, 21 Drawing Sheets

SIGNAL AMPLIFIER AND OPTICAL SIGNAL RECEIVER USING THE SAME

This application is a continuation of application Ser. No. PCT/JP99/07376 filed Dec. 27, 1999.

FIELD OF THE INVENTION

The present invention relates to a signal amplifier and an optical signal receiver using the same, and more particularly, a signal amplifier suitable for amplification of a burst signal and a burst optical signal receiver using the same.

BACKGROUND OF THE INVENTION

In recent years, there has been increased expectation of a high-speed burst optical transmission system such as a PON (passive optical system) for use in an optical subscriber system.

In FIG. 1, a conceptual diagram of the PON system is shown. A plurality of subscribers #1–#n are connected to a coupler 200 through optical transmission lines 200-1–200-n. Further, coupler 200 and an switching office 201 are interconnected through an optical backbone line 202.

A cell-formed optical signal in a burst form is output from each of the plurality of subscribers #1–#n. The optical signals 203–205 are forwarded to switching office 201 through coupler 200 and optical backbone line 202.

Here, as shown in FIG. 1, the distance between coupler 200 and each of the plurality of subscribers #1–#n is different, resulting in different levels of cell-formed optical signals being output from coupler 200. This necessitates an optical signal receiver on the switching office to have a wide input dynamic range so as to amplify these signals in common.

In FIG. 2, there is shown an exemplary configuration of the optical signal receiver for receiving the optical burst signals under the aforementioned condition, which was formerly proposed by the inventor of the present invention. In FIG. 2, an optical signal is received in a photodiode (PD) 100, to convert into an electric current signal. The signal is then input to a pre-amplifier 101.

Pre-amplifier 101 converts this electric current signal into a voltage signal. A trans-impedance amplifier 103 constituting pre-amplifier 101 includes an amplifier 103A having a diode 103C connected in parallel with a feedback resistor 103B, so as to produce a wider dynamic range.

When an excessive input signal is received, diode 103C is turned on to reduce the feedback resistance so as to prevent the amplifier from saturation. Thus, desirable output waveform having a wide input dynamic range can be obtained from a buffer amplifier 104 incorporating a signal polarity inverting function.

Signal amplifier 102 is constituted by a master-slave automatic threshold control (ATC) circuit 106 and a limiter amplifier 108. Signal amplifier 102 amplifies a weak signal being output from buffer amplifier 104 provided in pre-amplifier 101 to obtain logic signals of sufficient level.

Master-slave ATC circuit 106 includes a master peak detector 106B for detecting the maximum input signal value and a slave bottom detector 106A for detecting a relatively minimum value from the peak detection level. These outputs are resistively divided by a serially connected resistive voltage divider 106C. Thus an intermediate value is obtained as a DC voltage level for setting a threshold level against a limiter amplifier 108.

Now, in each subscriber #1–#n, optical signal is emitted by driving a laser diode. Here, bias current is made to flow from a few bits before the cell-formed optical signal. This reduces light emission delay and improves output waveform.

In FIG. 3, there is shown a diagram of input current amplitude versus output voltage amplitude in pre-amplifier 101 in the optical signal receiver shown in FIG. 2. An extinction ratio on transmitter in driving the laser is, for example, on the order of 10 dB or less. Input current amplitude I includes DC level II, as a bias current, corresponding to the extinction ratio mentioned above.

Meanwhile, as shown in the figure, the characteristic of input current amplitude versus output voltage amplitude in pre-amplifier 101 becomes nonlinear because of diode 103C. This produces a large amount of ascent on the '0' level in the output III of pre-amplifier 101.

As a result, a problem arises that the amplitude level to be detected by bottom detector 106A becomes higher than the transient minimum value. To cope with this problem, master-slave ATC circuit 106 is applied in signal amplifier 102, as shown in FIG. 2. This enables to detect the signal amplitude level certainly, because the use of slave bottom detector 106A enables to detect the minimum value after the peak level is determined.

However, the signal amplifier shown in FIG. 2, which has formerly been proposed by the inventors of the present invention, is used for one-way signal transmission. There is a problem that the signal is possibly deteriorated caused by external noise, etc.

Namely, when an external noise enters in the transmission line between pre-amplifier 101 and signal amplifier 102, there arises a drift in the input signal. In such a case, the output signal of limiter amplifier 108 is drifted because the threshold value produced from voltage divider 106C responds slowly and, as a result, little variation is produced. This produces difficulty in normal transmission.

FIG. 4 shows signal waveform responses ① to ⑥ at the corresponding positions of signal amplifier 102 shown in FIG. 2. In FIG. 4A, the peak value and the bottom value of the input signal waveform response ① are detected by peak detector 106B and bottom detector 106A, respectively.

The example shown in FIG. 4A illustrates a case that an external noise enters at the part of input signal waveform response ① shown by the circle with the broken line. In FIG. 4B, there is shown an example that the intermediate value between the peak value and the bottom value is set as a threshold value ④ by voltage divider 106C.

Further, FIG. 4 illustrates that a normal phase output ⑤ and an inverse phase output ⑥ are obtained as the output signals. These outputs are derived from the input signal waveform response ① being referenced from the threshold value ④. It is to be understood that noise component included in the output remains unchanged.

As shown in FIG. 4C, according to the configuration of the optical receiver shown in FIG. 2, there is a problem that waveform deterioration is produced by external noise, etc., because of single signal transmission.

SUMMARY OF THE INVENTION

Accordingly, it is an object of the present invention to provide a signal amplifier configuration and an optical signal receiver using the same. This can solve the problem of waveform deterioration produced by external noise, etc. in a signal amplifier of the formerly invented optical signal receiver shown in FIG. 2.

According to the present invention, an optical signal receiver to solve the aforementioned problem includes; a first master-slave level detector for detecting a direct voltage level of a normal phase signal; and a second master-slave level detector for detecting a direct voltage level of an inverse phase signal. Differential signal transmission is realized by adding respective signals to the signal components alternately. Thus, according to the present invention, differential transmission becomes possible using two master-slave level detectors constituted by mutually symmetric configuration. It becomes possible to obtain a signal amplifier which can cope with various transient responses produced at the top of a burst cell, and to protect against the disturbance produced by external noise.

As one aspect of the present invention, there is provided a signal amplifier including; a first level detector for detecting a direct voltage level of a normal phase signal; a first adder for adding an inverse phase signal to the detection output of the first level detector; a second level detector for detecting a direct voltage level of the inverse phase signal; a second adder for adding the normal phase signal to the detection output of the second level detector; and a differential amplifier for differential-amplifying the outputs of the aforementioned first and second adders.

As another aspect of the present invention, a signal amplifier includes; a first level detector for detecting a direct voltage level of either a normal phase signal or an inverse phase signal; a first adder for adding either the inverse phase signal or the normal phase signal to the detection output of the first level detector; a second adder for adding the normal phase signal to the inverse phase signal; and a differential amplifier for differential-amplifying the outputs of the aforementioned first and second adders.

Further scopes and features of the present invention will become more apparent by the following description of the embodiments with the accompanied drawings.

THE PREFERRED EMBODIMENTS OF THE INVENTION

The preferred embodiment of the present invention is described hereinafter referring to the charts and drawings, wherein like numerals or symbols refer to like parts.

Figure 5:
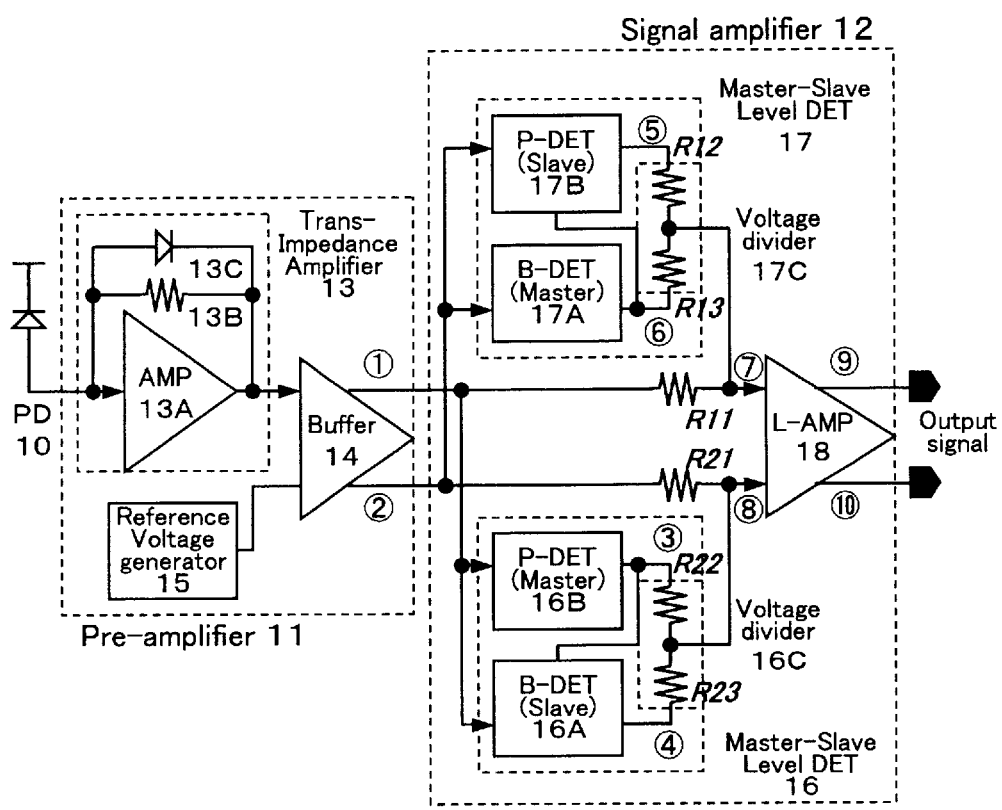
FIG. 5 shows a first embodiment of the burst optical signal receiver according to the present invention.

FIG. 5 shows a configuration diagram of a burst optical signal receiver according to a first embodiment of the present invention. FIG. 6 shows waveform responses corresponding to respective positions ①–⑩ in the circuit configuration of the embodiment shown in FIG. 5.

Pre-amplifier 11 receives a current signal corresponding to the signal received from photodiode (PD) 10 to convert to a voltage signal.

Trans-impedance amplifier 13 is constituted by an amplifier 13A, having a feedback resistor 13B and a diode 13C being connected in parallel to broaden the dynamic range.

In case an excessive input signal is received, diode 13C is turned on, thus decreasing the feedback resistance to prevent the amplifier from saturation. In such a manner, wider dynamic range can be obtained.

Buffer amplifier 14 receives the output of trans-impedance amplifier 13 referenced from the output voltage of a reference voltage generator 15, to generate a normal phase input ①  and an inverse phase input ②. Namely, buffer amplifier 14 outputs a normal phase signal ① (shown in FIG. 6A) for an input to signal amplifier 12 and also outputs an inverse phase signal ② (FIG. 6B) for another input to signal amplifier 12.

Signal amplifier 12 is constituted by a first master-slave level detector 16, a second master-slave level detector 17, a limiter amplifier 18, and resistors R11, R12.

In the first master-slave level detector 16 being connected to the normal phase input ①, master peak detector 16B detects the maximum value ③ of the input signal. Also, slave bottom detector 16A detects a relatively minimum value ④ referenced from the maximum detection level being detected by peak detector 16B. An Intermediate division voltage level is produced by a voltage divider 16C consisting of resistors R22, R23, to output as the DC component.

Meanwhile, in the second master-slave level detector 17 being connected to the inverse phase input ② (FIG. 6B), master bottom detector 17A detects the minimum value of the input signal, and slave peak detector 17B detects a relatively maximum value referenced from the bottom detection level detected by bottom detector 17A. An intermediate division voltage level is produced by voltage divider 17C consisting of resistors R12, R13 to output.

Figure 6A:
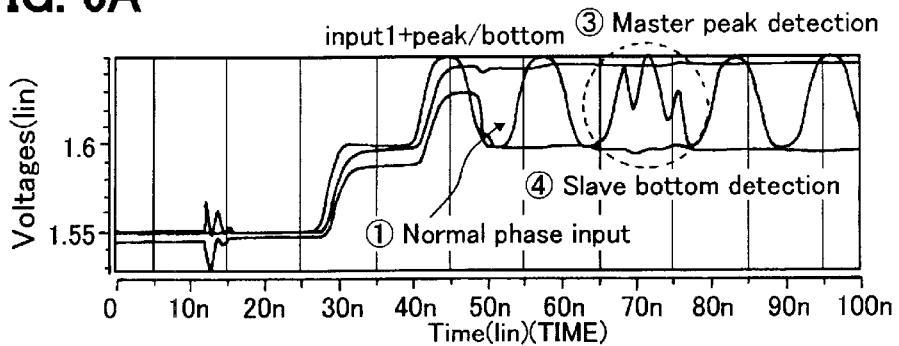
FIGS. 6A–6D show waveform responses corresponding to respective positions ① to ⑩ in the circuit configuration shown in FIG. 5.
Figure 6B:
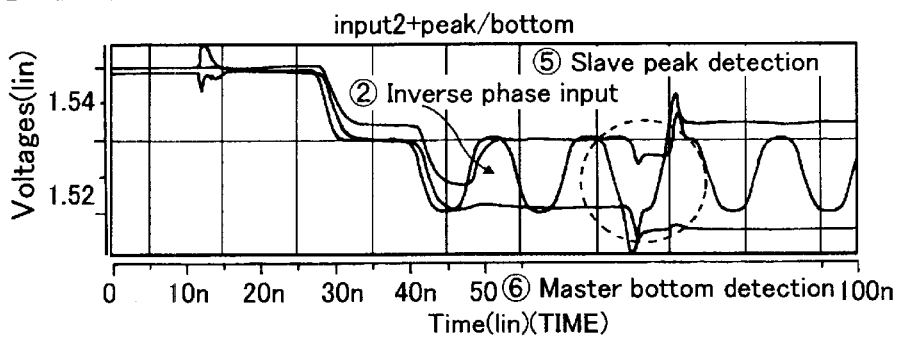
Figure 6C:
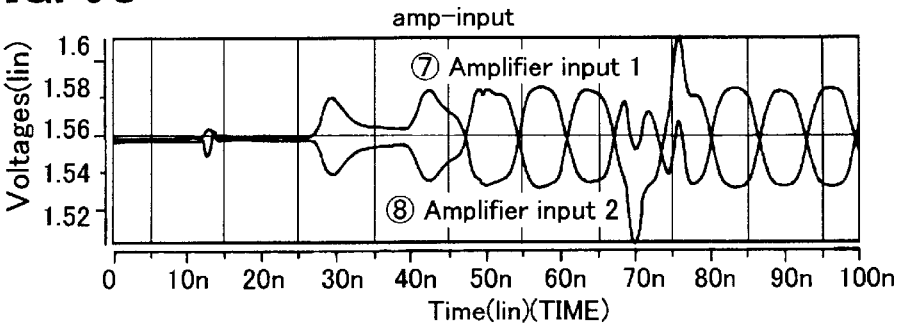

Next, as shown in FIG. 6C, the intermediate values having been obtained above by voltage dividers 17C, 16C are respectively added to signal inputs ①, ②, using resistors R11, R21. Thus symmetric differential signals ⑦, ⑧ are produced.

Here, each resistance ratio is set as, for example, R11:R12:R13=1:2:2, and R21:R22:R23=1:2:2.

Figure 6D:
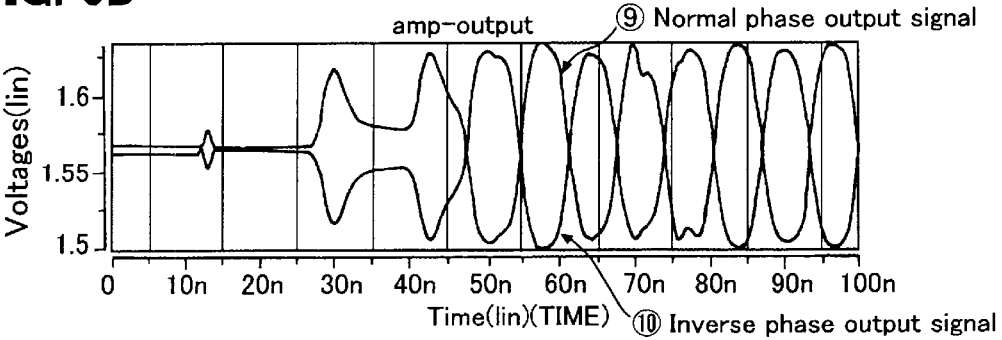

Further, differential signals ⑦, ⑧ are amplified by limiter amplifier 18 to output a normal phase output signal ⑨ and an inverse phase output signal ⑩, as shown in FIG. 6D.

Figure 7:
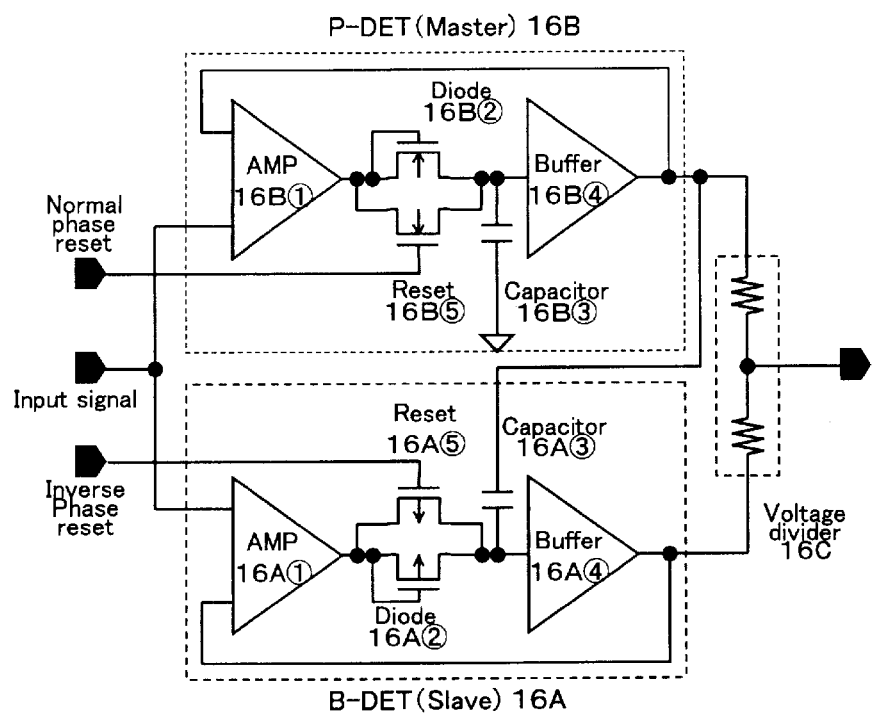
FIG. 7 shows an exemplary configuration of master-slave level detector 16 shown in FIG. 5.
Figure 8:
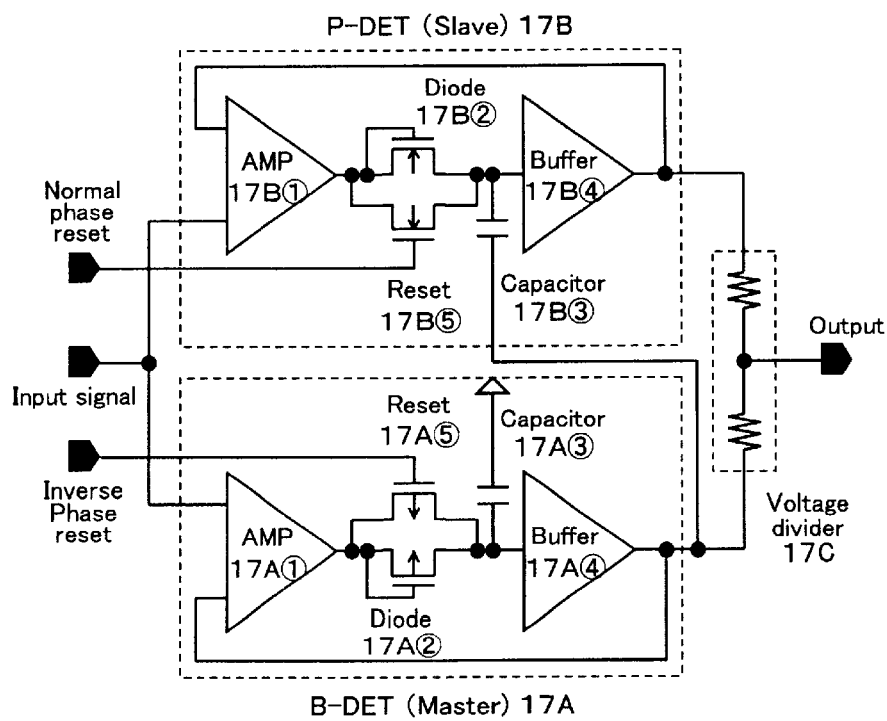
FIG. 8 shows an exemplary configuration of master-slave level detector 17 shown in FIG. 5.

Here, in FIGS. 7, 8, exemplary configurations of master-slave level detectors 16, 17 are shown. Peak detector 16B in master-slave level detector 16 is provided with a hold capacitor 16 ③ for charging the peak value of the normal phase input ① through differential amplifier 16B ① and diode 16B ②. Peak detector 16B outputs the peak value of the normal phase input ① being charged by this hold capacitor 16B ③ through buffer amplifier 16B ④.

Similarly, bottom detector 16A in master-slave level detector 16 is provided with a detection capacitor 16A ③ for charging the bottom value of the inverse phase input ② through differential amplifier 16A ① and diode 16A ②. Bottom detector 16A outputs the bottom value of the inverse phase input ② being charged by this detection capacitor 16A ③ through buffer amplifier 16A ④.

Here, bottom detector 16A is configured with hold capacitor 16A ③, one end of which is connected to the output port of peak detector 16B. Accordingly, it becomes possible for bottom detector 16A to detect a relative bottom value referenced from the maximum detection value detected by peak detector 16B.

FIG. 8 shows an exemplary configuration of master-slave level detector 17. This configuration is basically identical to the configuration of master-slave level detector 16 shown in FIG. 7, except that the inverse phase input ② is input and that one end of hold capacitor 17B ③ for detecting the peak value of the inverse phase input ② is connected to the output port of bottom detector 17A.

With such a configuration of master-slave level detectors 16, 17, it becomes possible to realize symmetric signals respectively having a normal phase and an inverse phase at the inputs of limiter amplifier 18, irrespective of transient response of the input signals (i.e. ascent of '0' level), as shown in the waveform responses in FIG. 6. Further, the realized differential transmission enables to maintain both the normal phase signal and the inverse phase signal to vary with the identical phase even when external noise enters (as shown in the broken line circle in FIG. 6). As a result, noise can be eliminated from the output signal.

Figure 9:
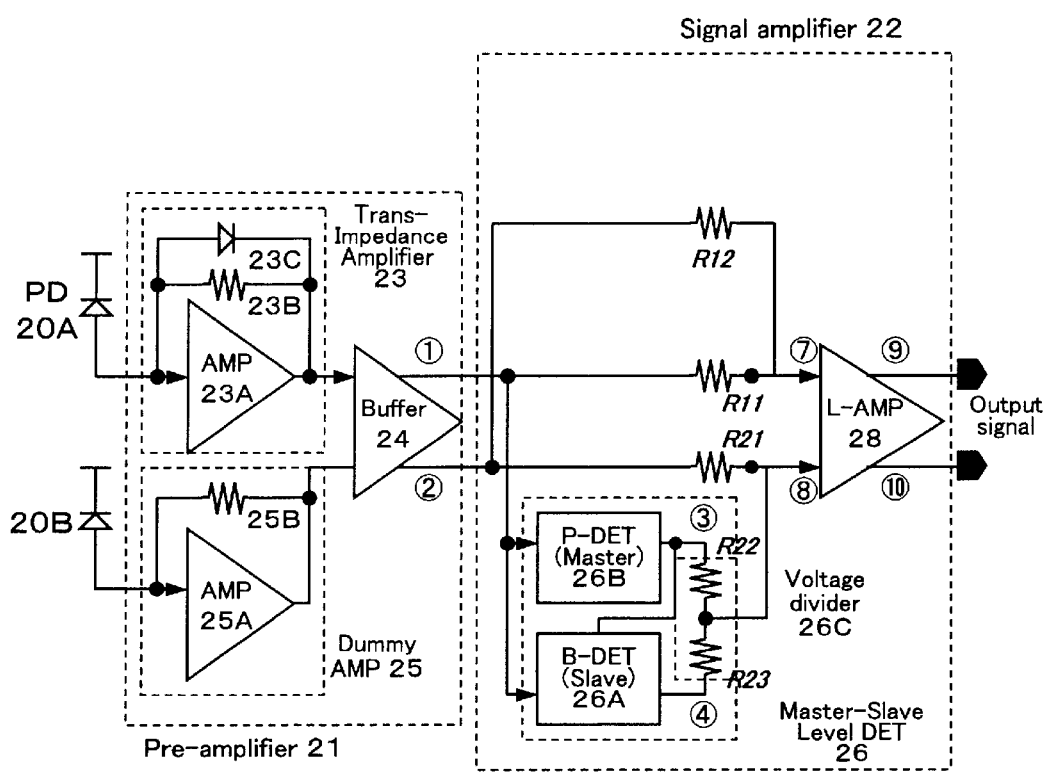
FIG. 9 shows a configuration diagram of a second embodiment of the optical signal receiver according to the present invention.
Figure 10A:
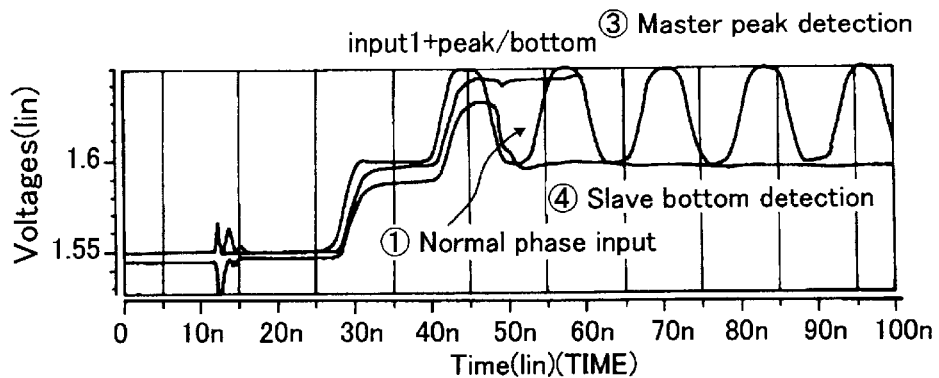
FIGS. 10A–10C show wave form responses ① to ⑩ corresponding to respective positions in the embodiment shown in FIG. 9.
Figure 10B:
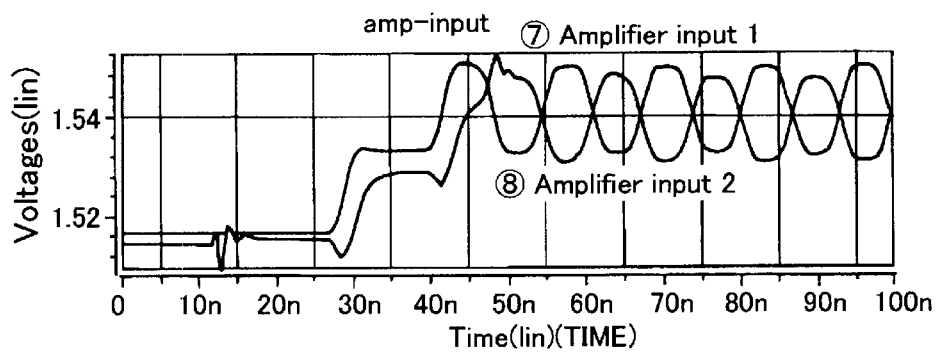
Figure 10C:
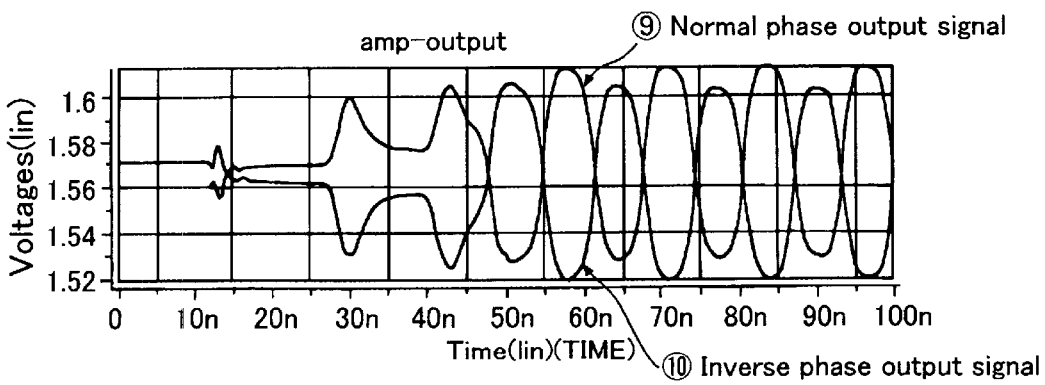

FIG. 9 shows a configuration diagram of the optical signal receiver according to a second embodiment of the present invention. FIG. 10 shows waveform responses ①–⑩ corresponding to respective positions in the optical signal receiver shown in FIG. 9.

In this embodiment, as compared to the embodiment shown in FIG. 5, the second master-slave level detector 17 is not provided. The output of master-slave level detector 26 being connected to the normal phase input ① of buffer amplifier 24 in pre-amplifier 21 is added to the inverse phase input ② by resistor R21.

Also, the normal phase input ① and the inverse phase input ② are added by resistors R12, R11, instead of the second master-slave level detector 17.

These added outputs are input to limiter amplifier 18 to obtain differential signals ⑨, ⑩.

Here, each resistance ratio is set as, for example, R11:R12=1:2, and R21:R22:R23=1:1:1.

According to this embodiment, a noise elimination characteristic is degraded as compared to the characteristic in the foregoing embodiment. The reason is that the symmetric property between the normal phase signal and the inverse phase signal is degraded, as shown in FIG. 10B. However, the second embodiment is advantageous in view of easy implementation of differential transmission. In addition, in the aforementioned second embodiment, master-slave level detector 26 is provided on the normal phase input side only. However, needless to say, similar effect can be obtained by a reversed configuration, in which the master-slave level detector is provided only on the inverse phase input side.

In this embodiment, there is provided a dummy amplifier 25 corresponding to trans-impedance amplifier 23 in pre-amplifier 21, thus enabling differential transmission within pre-amplifier 21 also. In such a manner the noise elimination characteristic can be improved.

Here, signal amplifier 22 can also be configured with the combination of a variety of pre-amplifiers 11, 21 incorporated in each embodiment, needless to say. Also, this method is effectively applicable in various applications other than the optical signal receiver.

Figure 11:
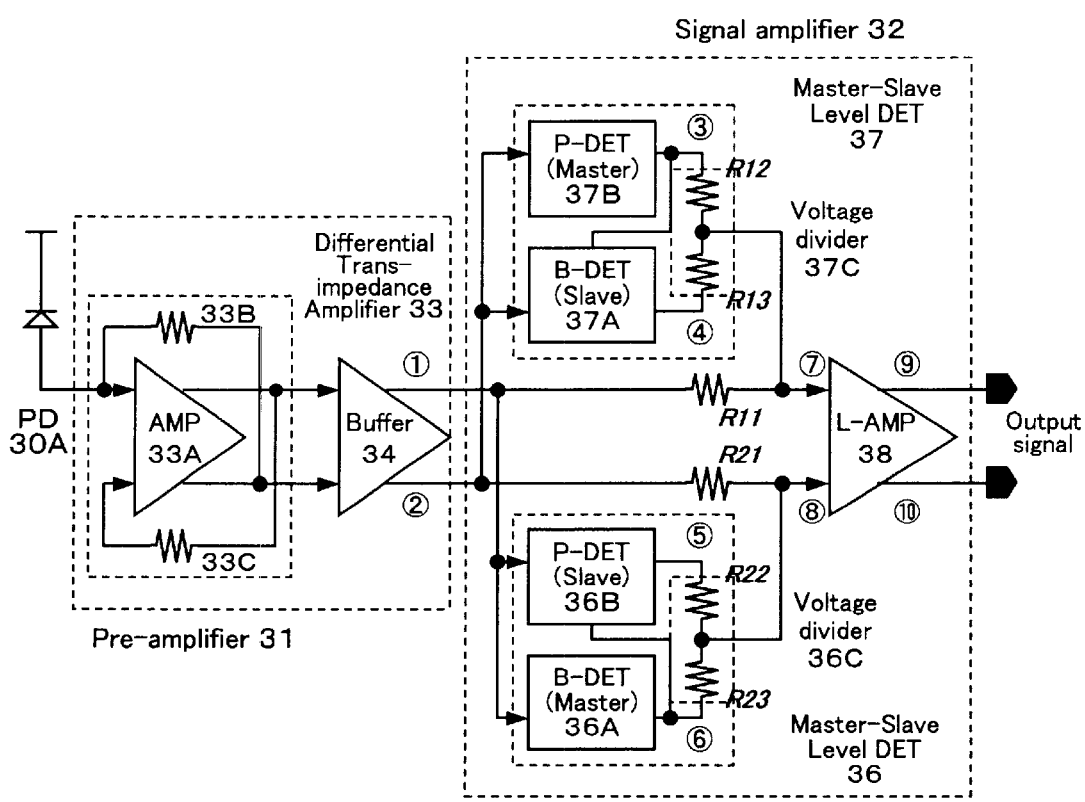
FIG. 11 shows a configuration diagram of a third embodiment of the optical signal receiver according to the present invention.

FIG. 11 shows a configuration diagram of a third embodiment of the optical signal receiver according to the present invention. In this embodiment, as compared to the embodiment shown in FIG. 5, trans-impedance amplifier 33 is configured of differential type. Also, the polarities of master-slave level detectors 36, 37 are reversed. This enables to cope with a transient response having the opposite polarity to the case in the foregoing embodiment. more specifically, this embodiment can cope with the case that the amplitude level to be detected by the peak detector is lower than the transient maximum value.

Figure 12A:
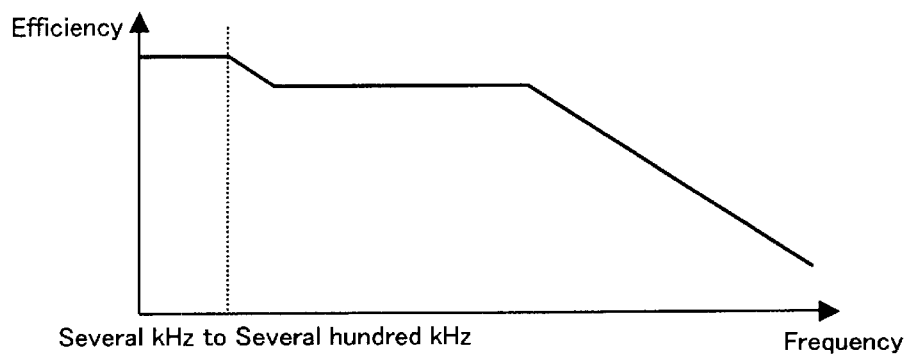
FIGS. 12A–12C show a waveform having a trail in the optical signal receiver as one example of the response waveform.
Figure 12B:
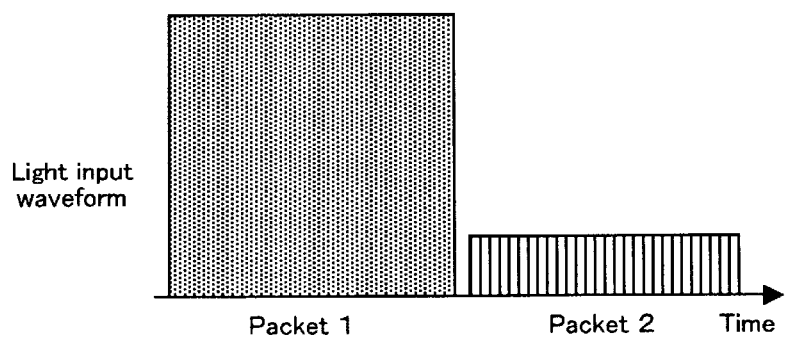
Figure 12C:
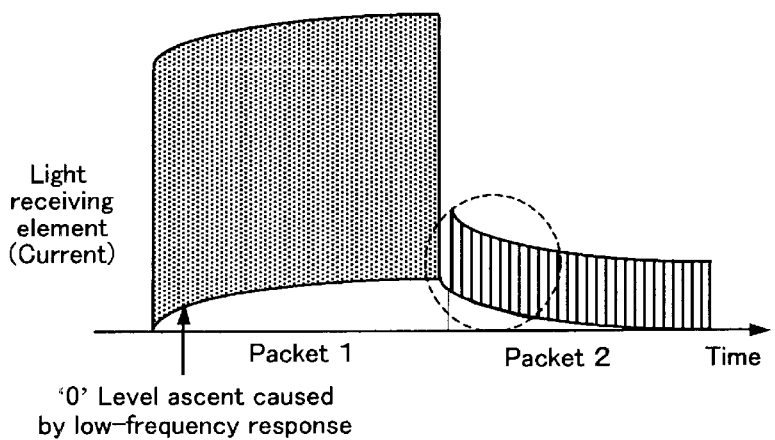
Figure 13A:
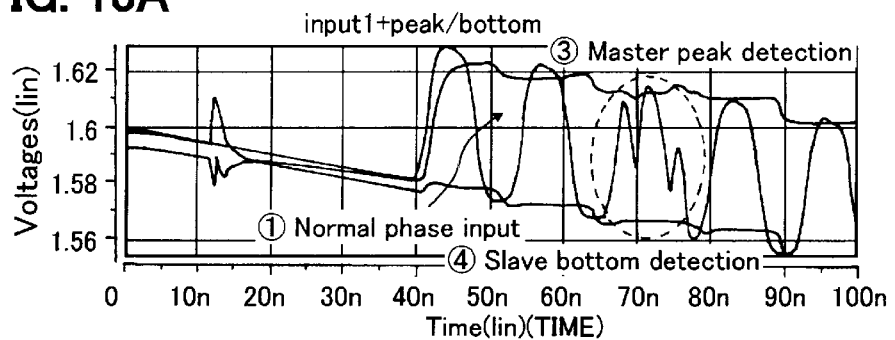
FIGS. 13A–13D show waveform responses according to the third embodiment of the present invention.
Figure 13B:
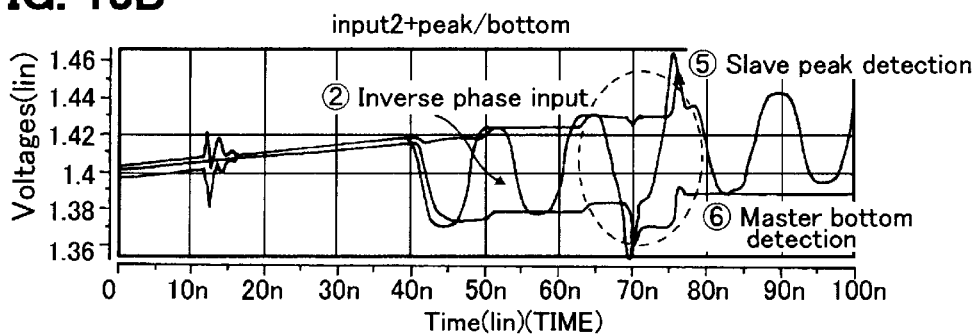
Figure 13C:
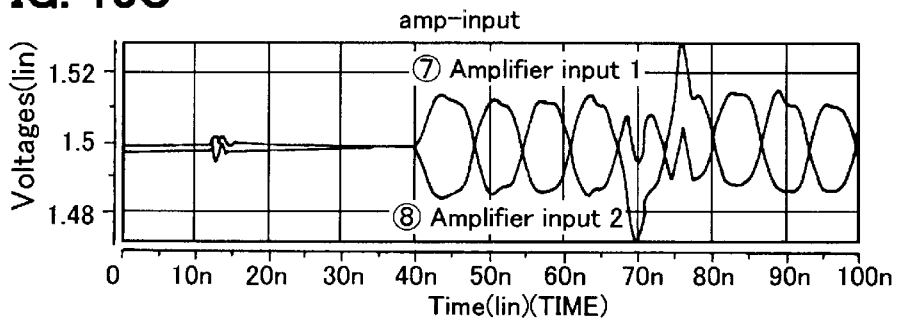
Figure 13D:
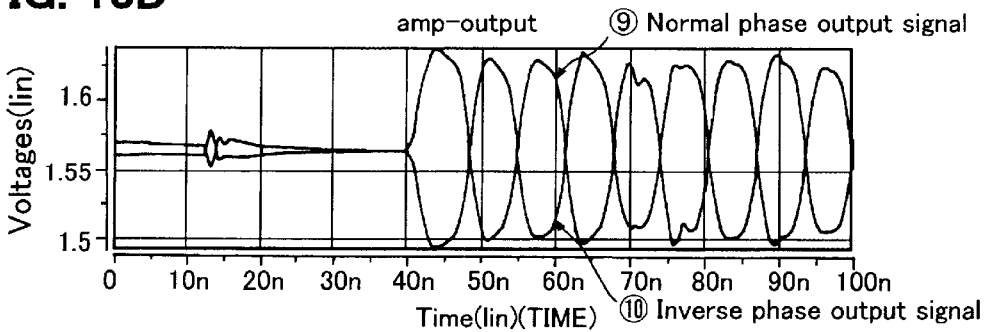

FIG. 12 shows an example of a waveform having a trail in the optical signal receiver, as an example of the response waveform in the aforementioned case. In general, the frequency characteristic of optical signal detector (PD) 30A has a shoulder in several kHz to several hundred kHz, as shown in FIG. 12A. Now, as shown in FIG. 12B, it is assumed that two burst cell signals (a packet 1 and a packet 2) arrive, in which one cell has optical signal power substantially different from the other cell. In such a case, an ascent of '0' level caused by the low frequency component of the foregoing large-signal cell (packet 1) influences the early part of the succeeding small-signal cell (packet 2), producing a trail, as shown in FIG. 12C.

FIG. 13 shows a diagram illustrating the waveform responses under such a situation mentioned above, according to the third embodiment of the present invention. Compared to the embodiment shown in FIG. 5, the reversed polarities of level detectors 36, 37 enable to cope with the decrease of the transient peak level caused by the trail, etc. Accordingly, in the inputs of limiter amplifier 38, it becomes possible to have symmetric signals ⑦, ⑧ between the normal phase input and the inverse phase input.

Figure 14:
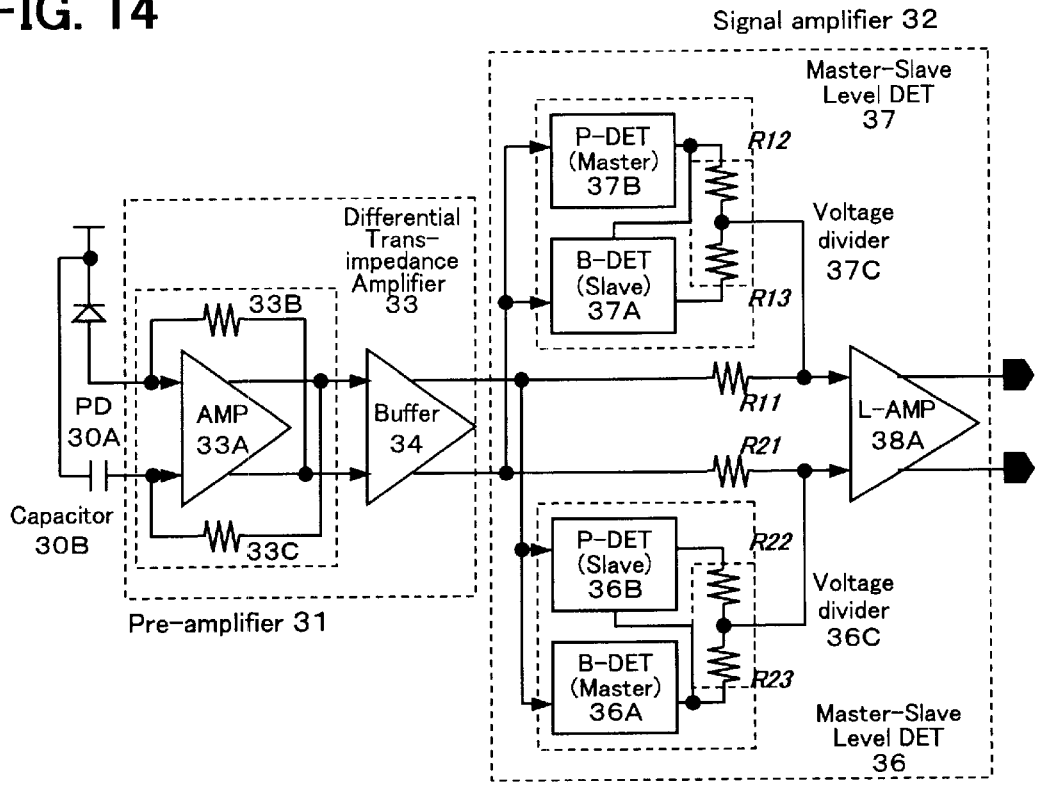
FIG. 14 shows an embodiment having a capacitor 30B inserted into a current source of a light receiving element (PD) 30A on the input side of pre-amplifier 31, in addition to the embodiment shown in FIG. 11.

In contrast to the embodiment shown in FIG. 11, FIG. 14 shows an embodiment having a capacitor 30B connected to one end of optical signal detector (PD) 30A on the reverse input side of pre-amplifier 31. This enables pseudo differentiation of the signal in the input portion of pre-amplifier 31 in a more effective manner, to avoid noise influence.

Also in this embodiment, a differential trans-impedance amplifier 33 is adopted within pre-amplifier 11 to realize differentiation, which is similar to the embodiment shown in FIG. 11. This enables to improve the noise elimination characteristic.

Figure 15:
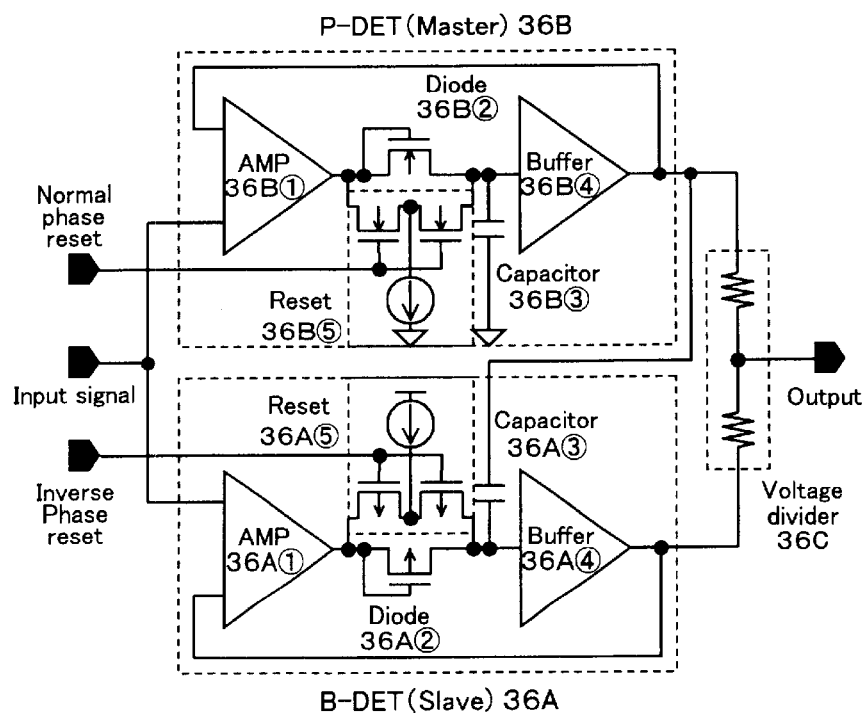
FIG. 15 shows an exemplary configuration diagram of master-slave level detector 36 for use in the embodiments shown in FIGS. 11 and 14.

Now, in FIG. 15, there is shown an exemplary configuration of master-slave level detector 36 being applied to the embodiments in FIGS. 11, 14. Here, master-slave level detector 37 has the same configuration as master/slave level detector 36 and therefore is not shown in this figure. In the configuration shown in FIG. 15, there are provided reset circuits 36A ⑤, 36B ⑤ each constituted by a current source circuit, enabling a forcible reset function. Using such a configuration, reset time can be reduced.

Figure 16:
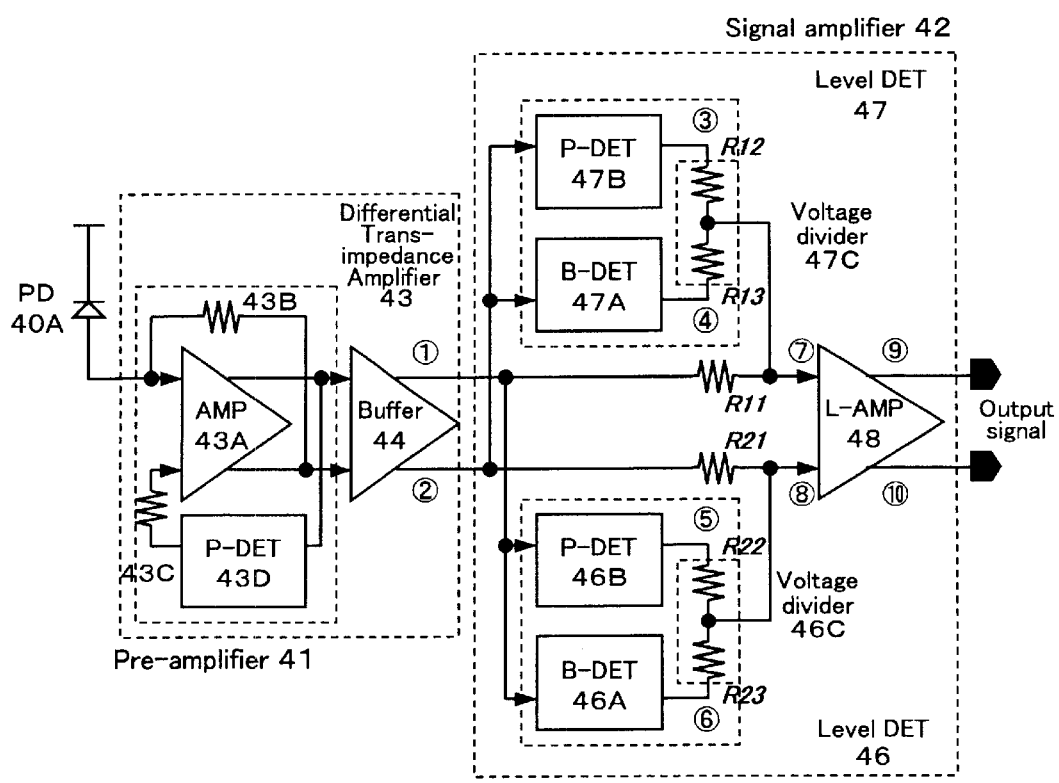
FIG. 16 shows a configuration diagram of a fourth embodiment of the optical signal receiver according to the present invention.

FIG. 16 shows a configuration diagram of the optical signal receiver according to a fourth embodiment of the present invention. FIG. 17 shows waveform responses thereof.

Figure 18:
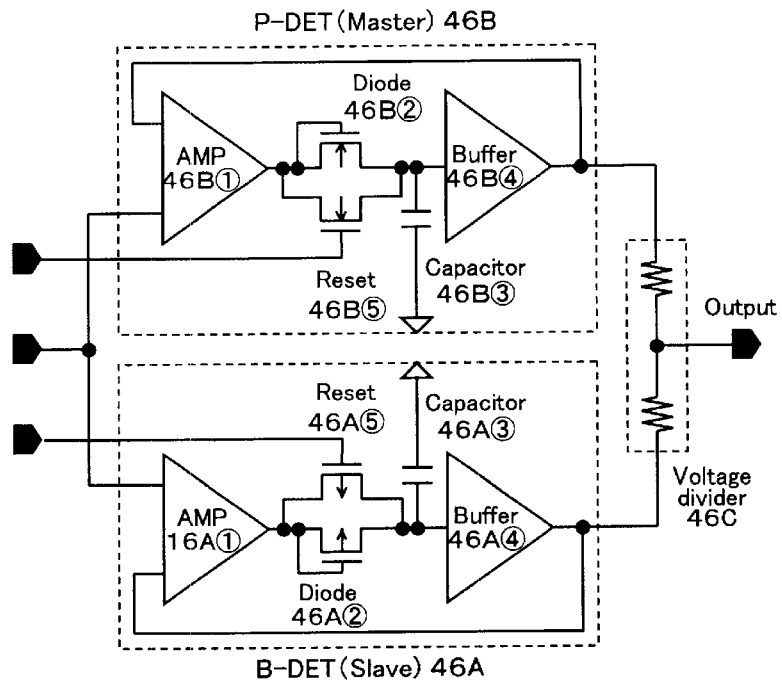
FIG. 18 shows an exemplary configuration diagram of level detector 46.

According to this embodiment, respective level detectors 46, 47 in signal amplifier 42 are configured by conventional peak/bottom detectors shown in FIG. 18. (Level detector 47 has the same configuration as level detector 48.) This is applicable when DC level does not vary.

Namely, peak detector 46B detects the peak value of the identical phase input ① by hold capacitor 46B ③. Also, bottom detector 46A detects the bottom value of identical phase input ① by hold capacitor 46A ③.

Further, in the embodiment shown in FIG. 16, it may also be possible to insert a peak detector 43D in pre-amplifier 41, instead of using the master-slave level detector, so as not to produce an ascent of the transient bottom level. This can simplify the circuit configuration.

Figure 17A:
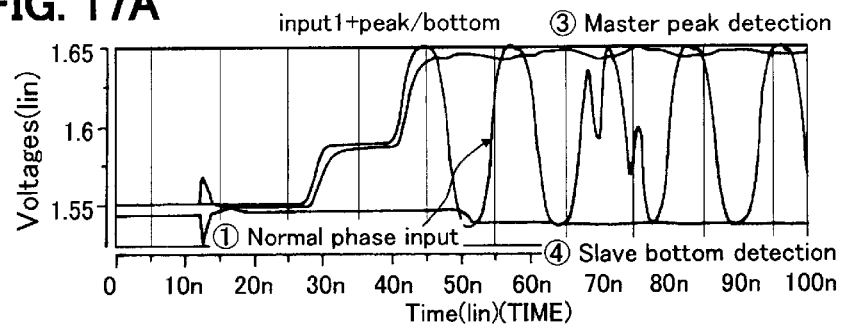
FIGS. 17A–17D show waveform responses at the corresponding positions shown in FIG. 16.
Figure 17B:
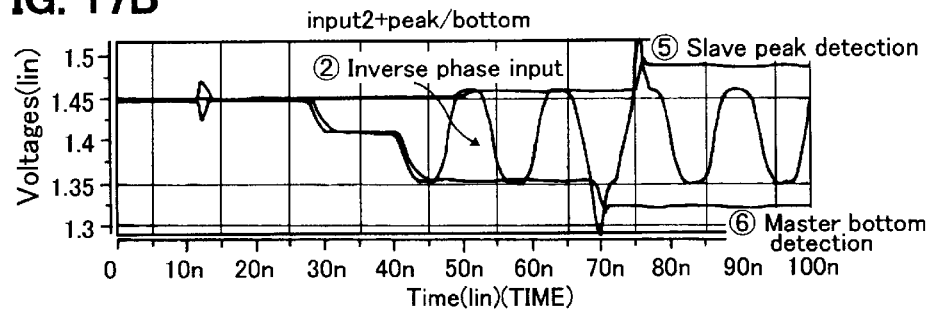

Referring to FIG. 17A, a peak value ⑤ of a normal phase input ① is detected by peak detector 46B in level detector 46, while a bottom value ⑥ of the normal phase input ① is detected by bottom detector 46A. Also, as shown in FIG. 17B, a peak value ③ of an inverse phase input ② is detected by peak detector 47B, while a bottom value ④ is detected by bottom detector 47A.

Figure 17C:
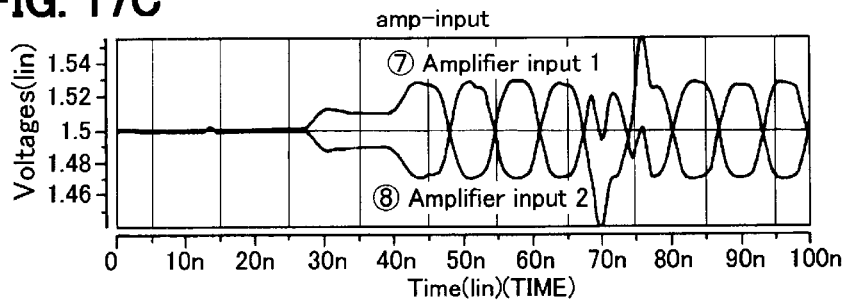

In FIG. 17C, the peak detection value ⑤ and bottom detection value ⑥ respectively detected in level detector 46 are resistively divided by voltage divider 46C to add to the inverse phase input ② to input to the input end ⑧ of limiter amplifier 48. Similarly, the peak detection value ③ and the bottom detection value ④ detected in level detector 47 are resistively divided by voltage divider 47C to add to the identical phase input ① to input to the input end ⑦ of limiter amplifier 48.

Figure 17D:
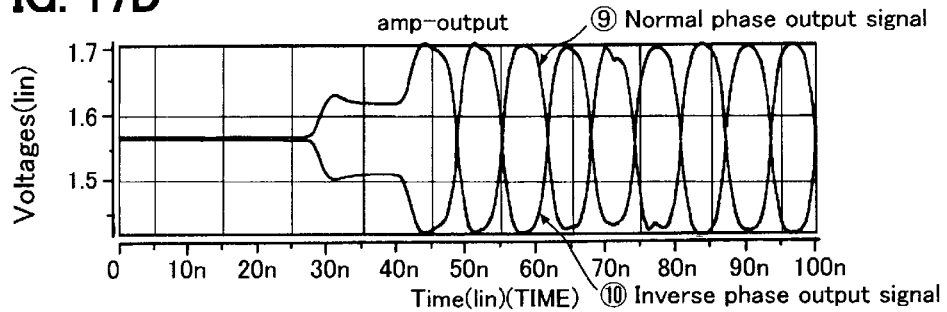

Accordingly, as shown in FIG. 17D, by amplifying these values in limiter amplifier 48, it becomes possible to obtain good waveform responses of a normal phase output signal ⑨ and an inverse phase output signal ⑩, in which noise is eliminated.

Figure 19:
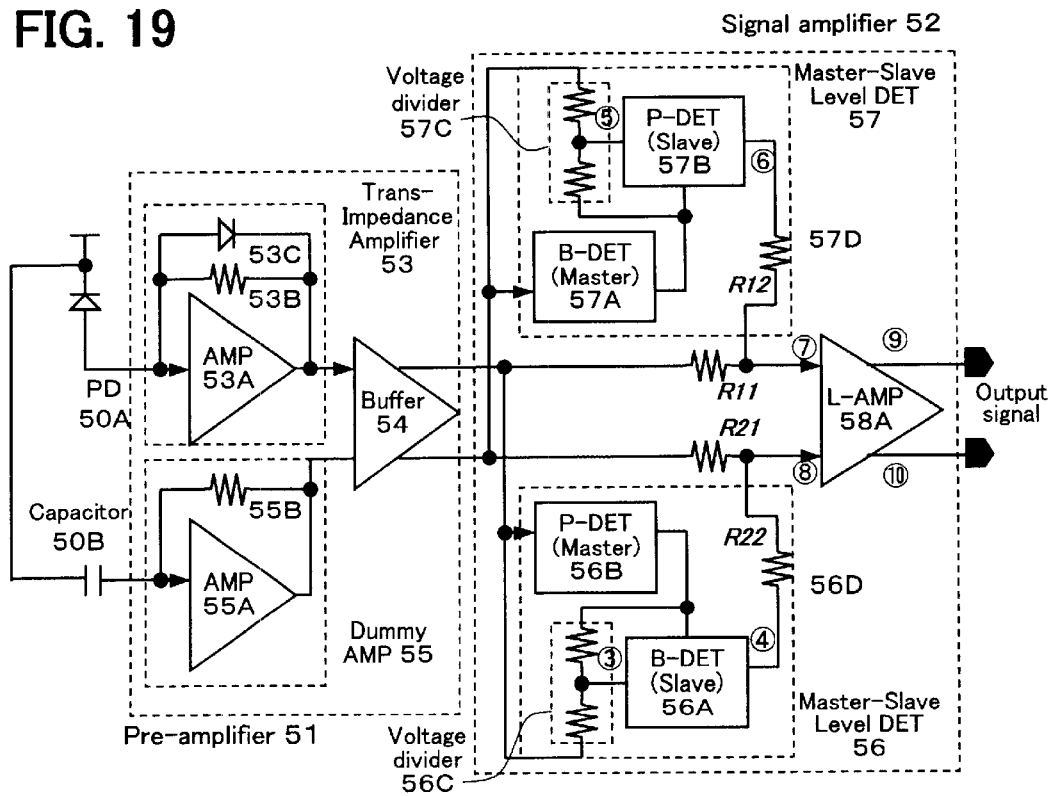
FIG. 19 shows an exemplary configuration diagram of a fifth embodiment of the optical signal receiver according to the present invention.
Figure 20A:
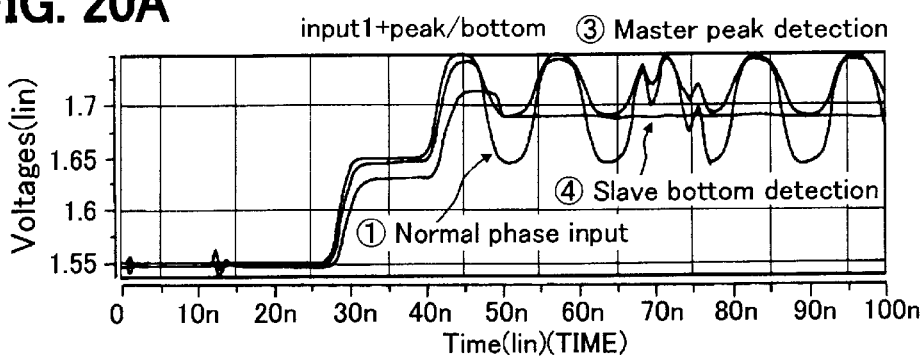
FIGS. 20A–20D show wave form responses ① to ⑩ corresponding to respective positions shown in FIG. 9.
Figure 20B:
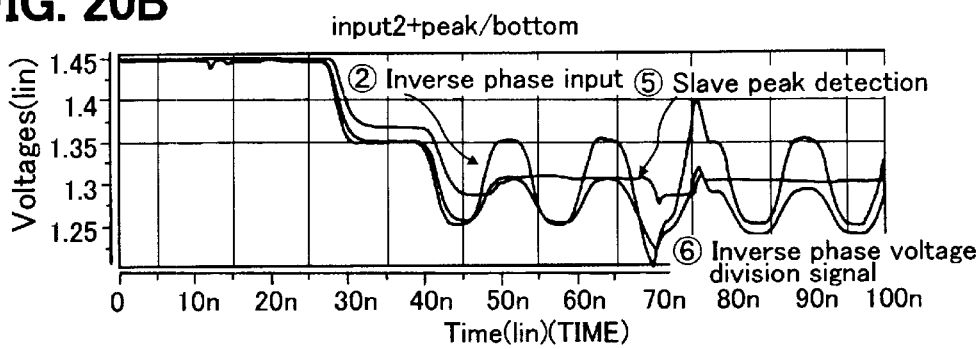
Figure 20C:
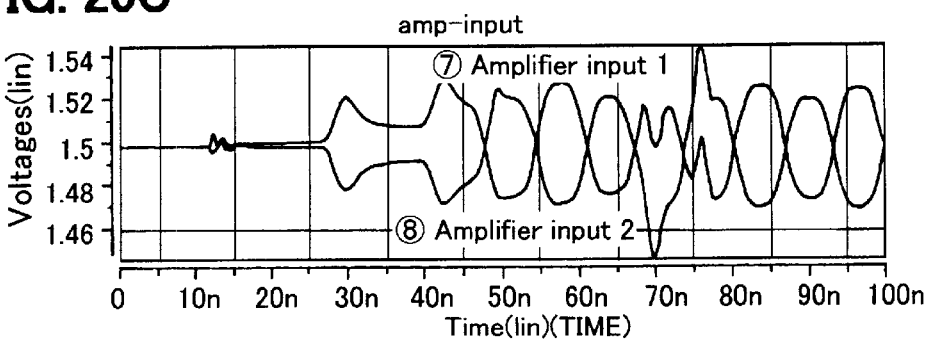
Figure 20D:
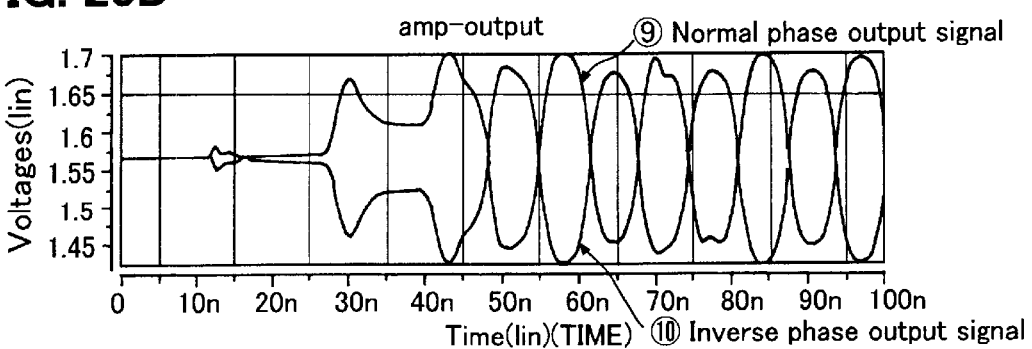

FIG. 19 shows a configuration diagram of the optical signal receiver according to a fifth embodiment of the present invention. FIG. 20 shows waveform responses of the corresponding positions ①–⑩ shown in FIG. 19.

In this example, there are employed in signal amplifier 52 master-slave level detectors 56, 57 respectively having different configurations from those employed in the foregoing embodiments. The typical configurations thereof are shown in FIGS. 21, 22.

Figure 21:
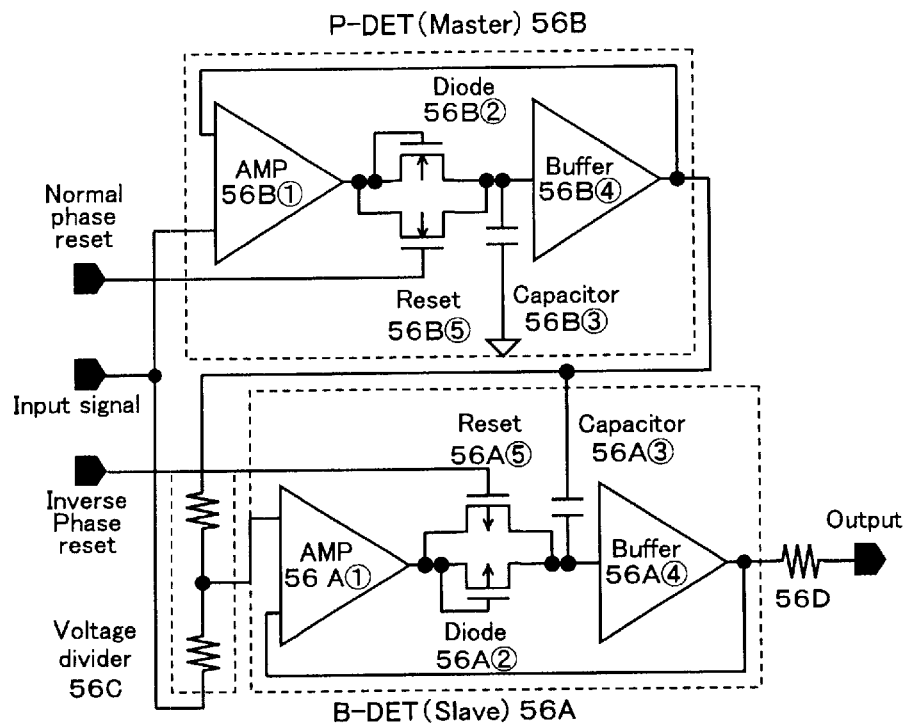
FIG. 21 shows an exemplary configuration of master-slave level detector 56.
Figure 22:
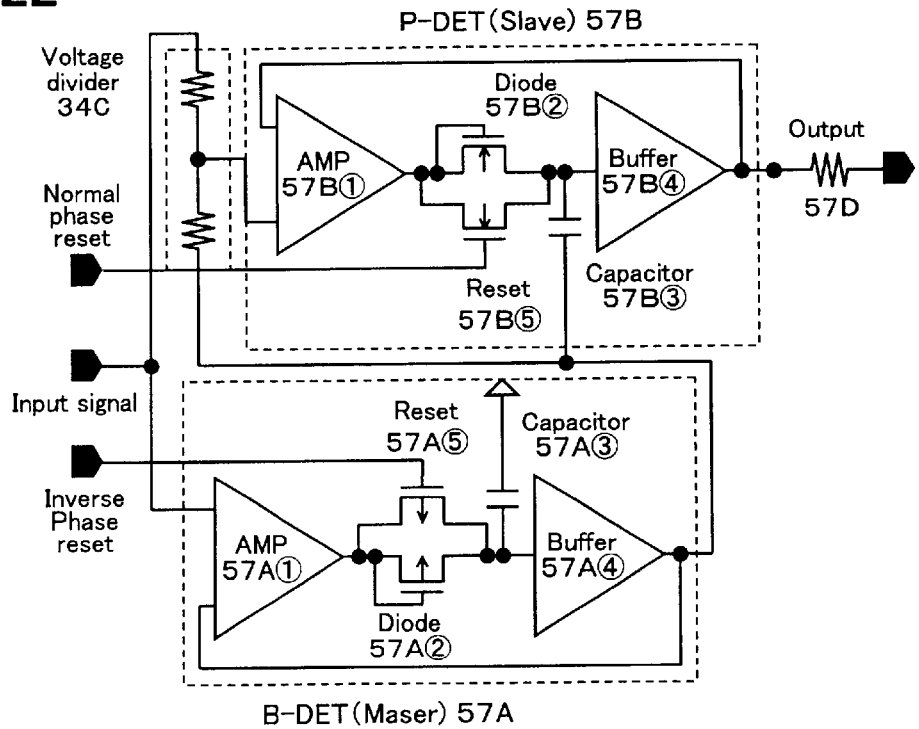
FIG. 22 shows an exemplary configuration of master-slave level detector 57.

FIG. 21 shows a configuration example of master-slave level detector 56, and FIG. 22 shows a configuration example of master-slave level detector 57.

According to these configurations, in a first master-slave level detector 56 being connected to a normal phase input ①, as shown in FIG. 21, peak detector 56B detects the maximum value of input signal ①. Voltage divider 56C then produces a voltage division signal having a half (½) value of the amplitude of this maximum value.

Bottom detector 56A detects a relative minimum value of the voltage division signal level from voltage divider 56C being referenced from the maximum detection level.

In the second master-slave level detector 57 shown in FIG. 22, the operation is similar to the above.

Moreover, in the configuration according to the embodiment shown in FIG. 19, the input of differential trans-impedance amplifier 53 in dummy amplifier 55 of pre-amplifier 51 is connected to the power source of optical signal detector (PD) 50 through capacitor 50B. Using such a configuration, pseudo differential transmission of the input portion is enabled, thus eliminating noise or the like entering into the power supply of optical signal detector (PD) 50.

Figure 23:
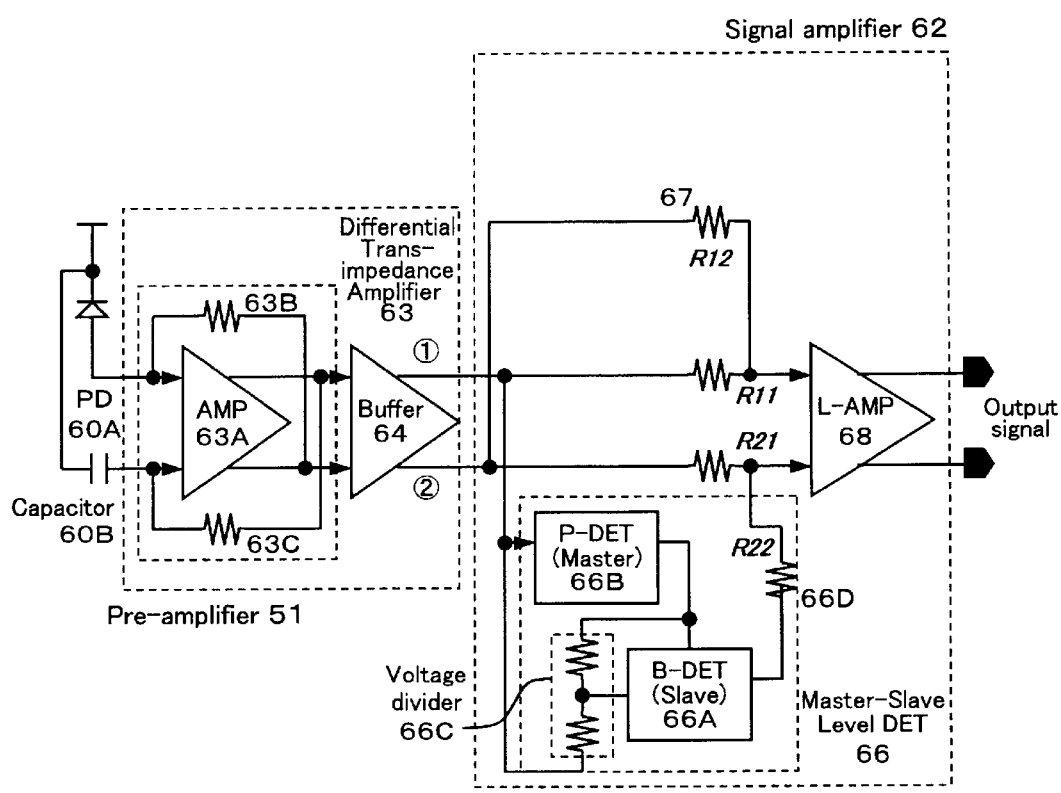
FIG. 23 shows a configuration diagram of the optical signal receiver according to a sixth embodiment of the present invention.

FIG. 23 shows a configuration diagram of the optical signal receiver according to a sixth embodiment of the present invention. In this embodiment, in contrast to the configuration shown in FIG. 19, level detector 66 is provided only on one side, as in the configuration of the second embodiment shown in FIG. 9.

In this configuration example, each resistance ratio is set to, for example, R11:R12=1:2, and R21:R22=1:2.

Figure 24:
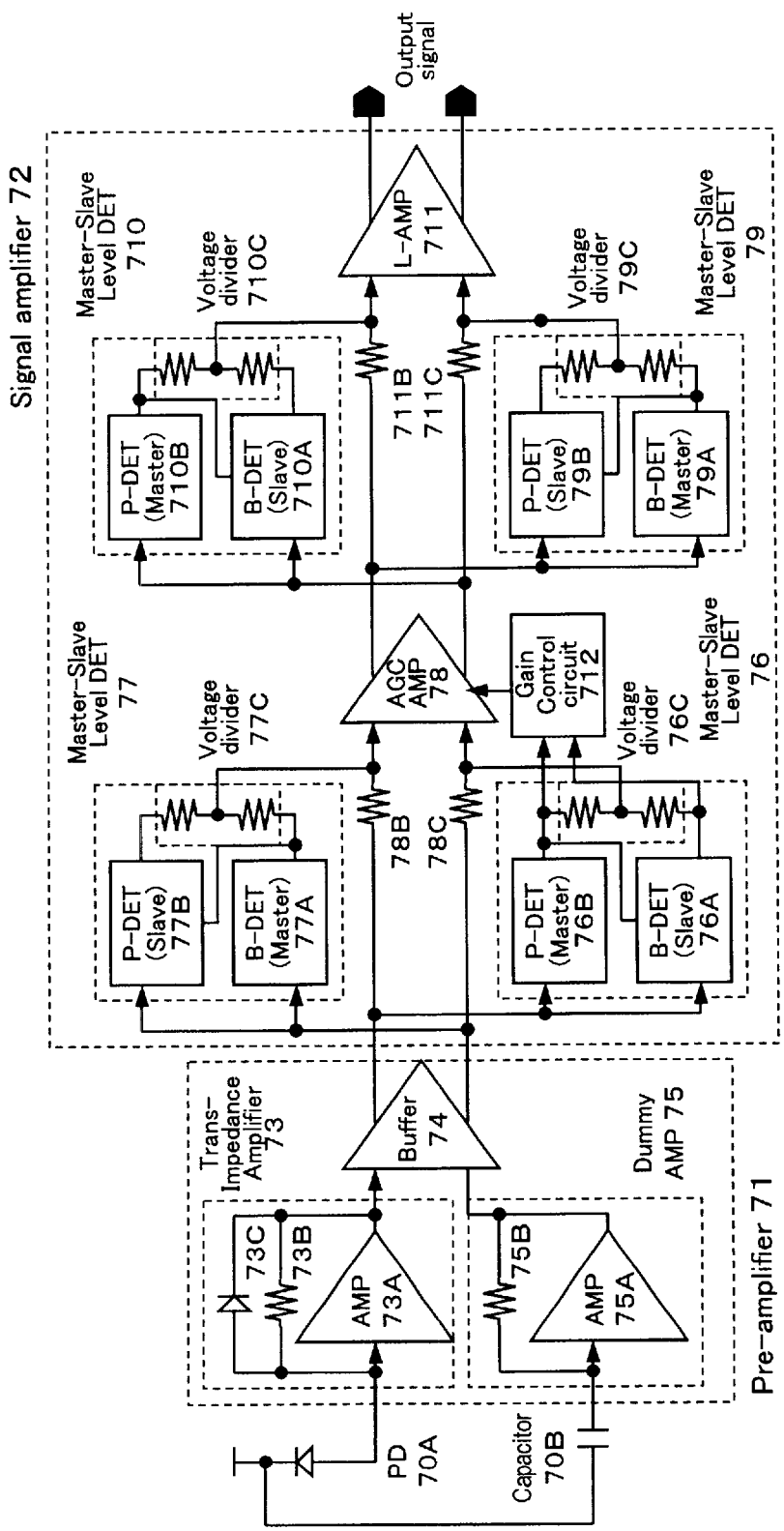
FIG. 24 shows an exemplary configuration diagram of the optical signal receiver according to a seventh embodiment of the present invention.

FIG. 24 shows a configuration diagram of the optical signal receiver according to a seventh embodiment of the present invention. In this embodiment, there is introduced a configuration of multi-stage amplifiers with the master-slave level detectors being configured with alternate polarities.

According to this configuration, the offset, etc. being existent in the first stage is detected by master-slave level detectors 79, 710 in the next stage to cancel, in the region in which the first stage amplifier 78A in signal amplifier 72 linearly amplifies the input signal being output from master-slave level detectors 76, 77. Thereby it becomes possible to reduce the waveform distortion caused by the offset.

Further, in this embodiment, an AGC amplifier is applied as the first stage amplifier 78, and a gain control circuit 712 performs feedforward control corresponding to the input amplitude, enabling to widen linear amplification range and further increasing the effect of the multi-stage connection.

Further, master-slave level detectors 79, 710 in the second stage are configured so as to have polarities opposite to the first stage. With this configuration, it becomes possible to cope with transient response having the polarity opposite to the first stage. For example, it is possible for the first level detectors 76, 77 to detect '0' level ascent caused by the deterioration of extinction ratio, and also for the second level detectors 79, 710 to detect the waveform having a trail which has been illustrated in FIG. 12.

Figure 25:
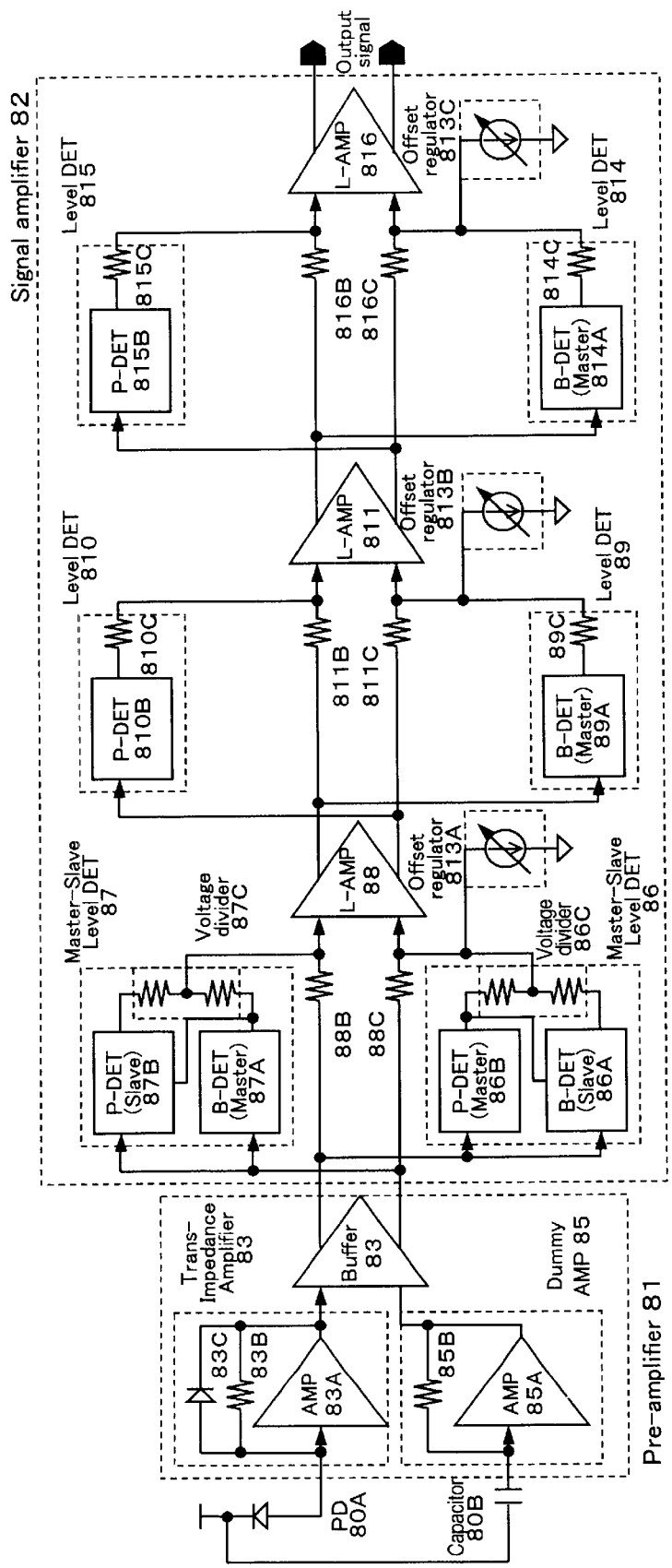
FIG. 25 shows an exemplary configuration diagram of the optical signal receiver according to an eighth embodiment of the present invention.

FIG. 25 shows a configuration diagram of the optical signal receiver according to an eighth embodiment of the present invention. In this embodiment, as in the case of the aforementioned seventh embodiment, amplifiers 98, 911, 916 are configured with a multi-stage connection.

In this configuration, the bottom detector is not provided for the normal phase input ① in the second stage and the succeeding stages, because vertically symmetrical bipolar signal can be obtained in the first amplifier output. Also the peak detector is not provided for the inverse phase input ②. Thus, once transient response is eliminated in the first stage, the level detectors in the succeeding stages can be simplified.

In this embodiment, there is shown a configuration having three-stage connection. With the increased number of stages, offset cancellation by means of the multi-stage connection becomes more effective. Furthermore, according to this embodiment, offset adjustment circuits 813B, 813C are provided in level detectors 89, 814 in the respective stages. These circuits reduce the influence of the offset, and accordingly the deterioration in the output waveform can be decreased.

Figure 1:
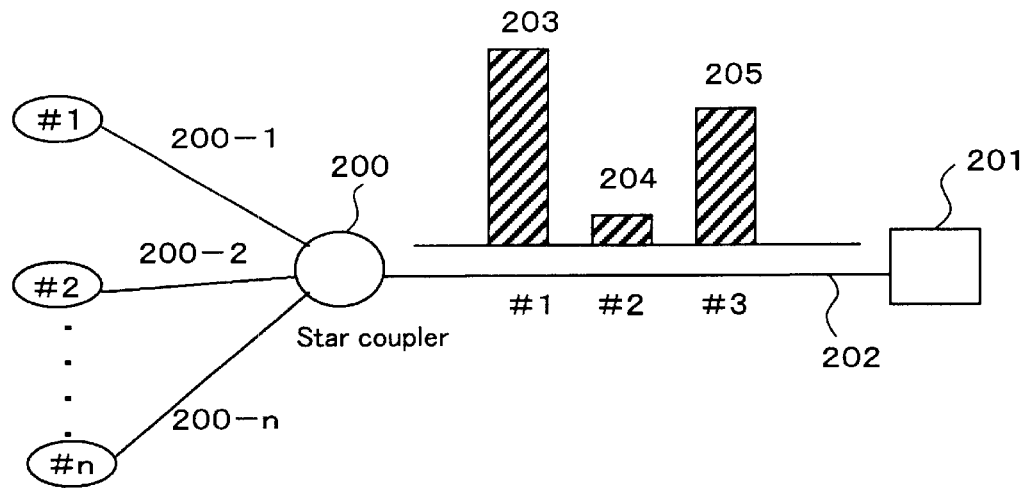
FIG. 1 shows a conceptual diagram of a burst optical transmission system.
Figure 2:
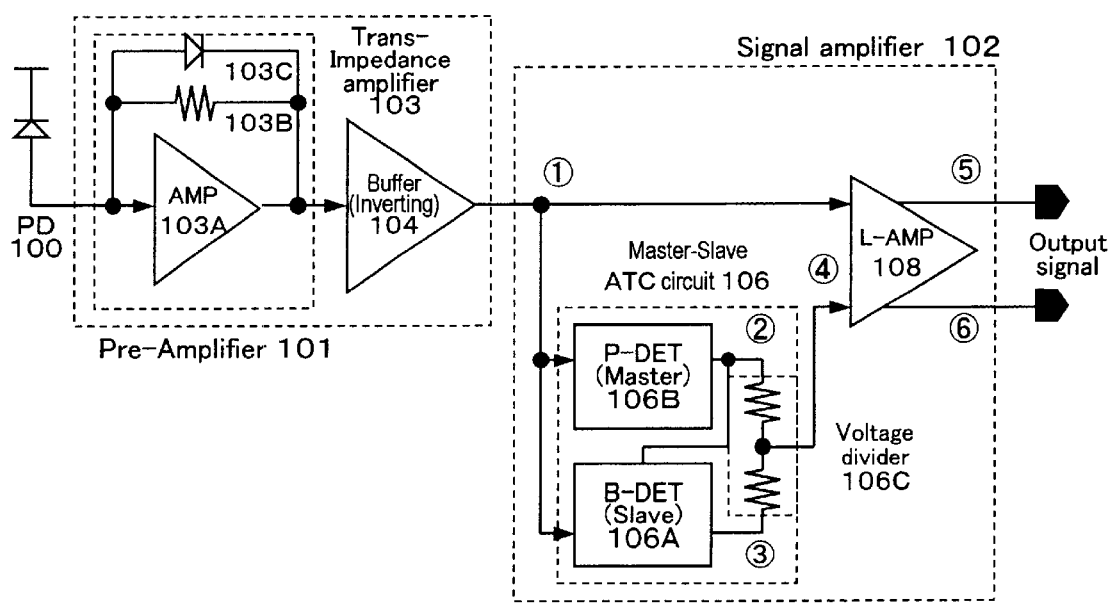
FIG. 2 shows an example of optical signal receiver for receiving such a burst optical signal, which was formerly disclosed by the inventors of the present invention.
Figure 3:
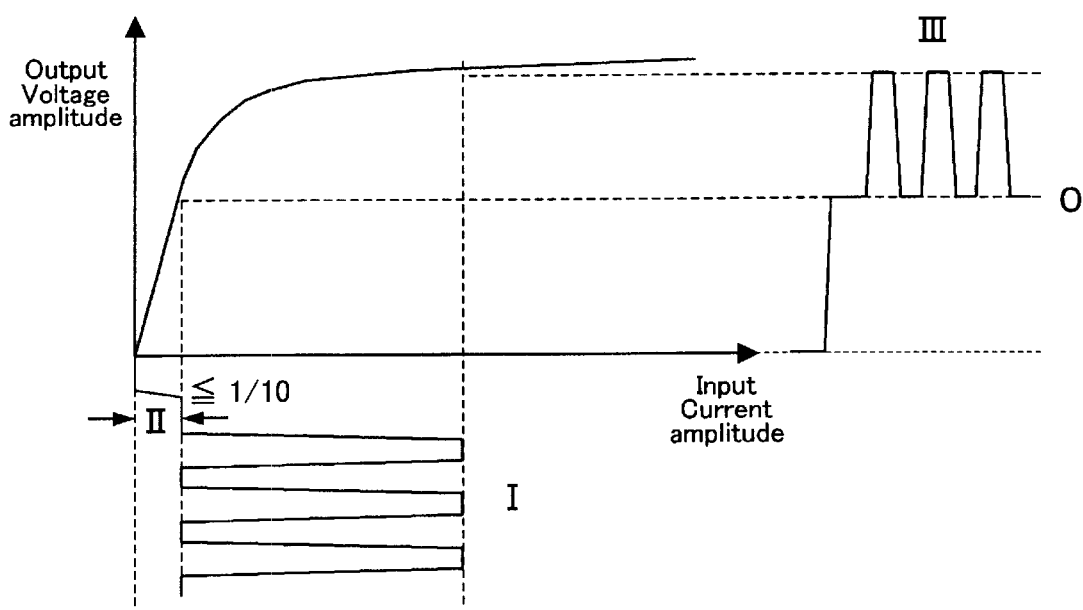
FIG. 3 shows a diagram illustrating input current amplitude versus output voltage amplitude in pre-amplifier 101 of the optical receiver shown in FIG. 2.
Figure 4A:
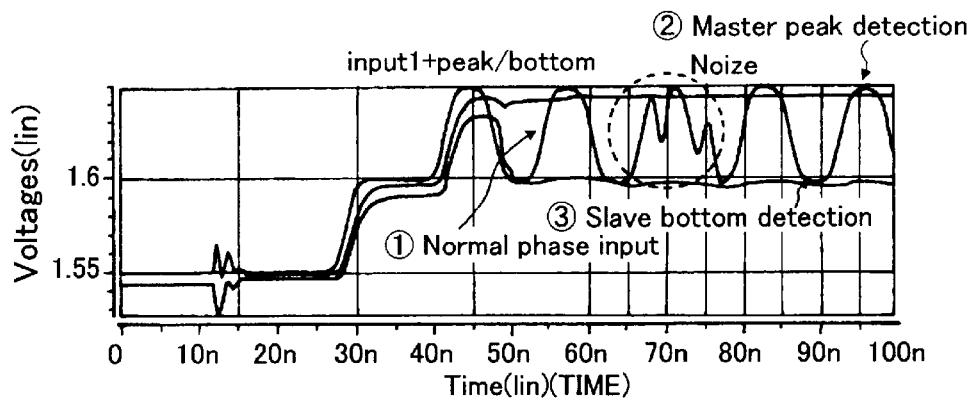
FIGS. 4A–4C show signal waveform responses ① to ⑥ corresponding to respective positions in signal amplifier 102.
Figure 4B:
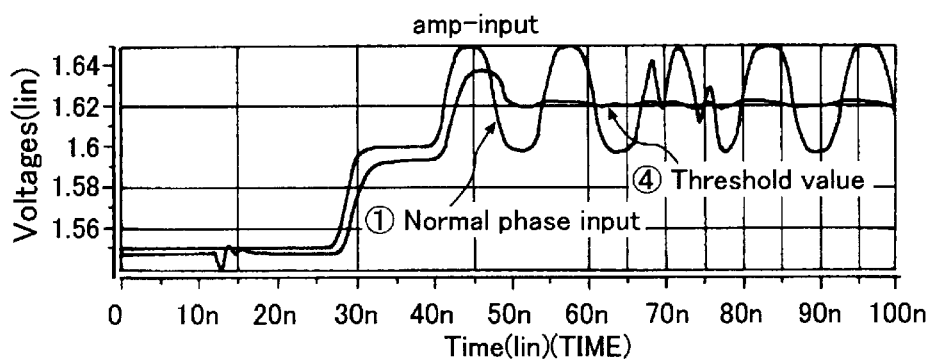
Figure 4C:
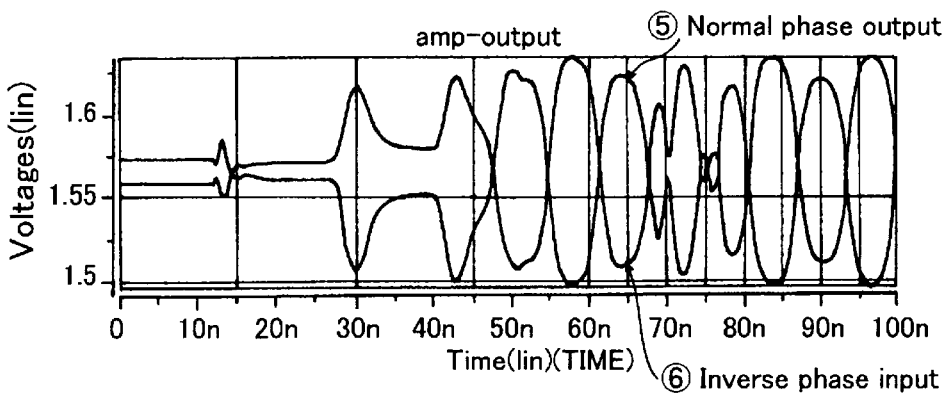
Figure 26:
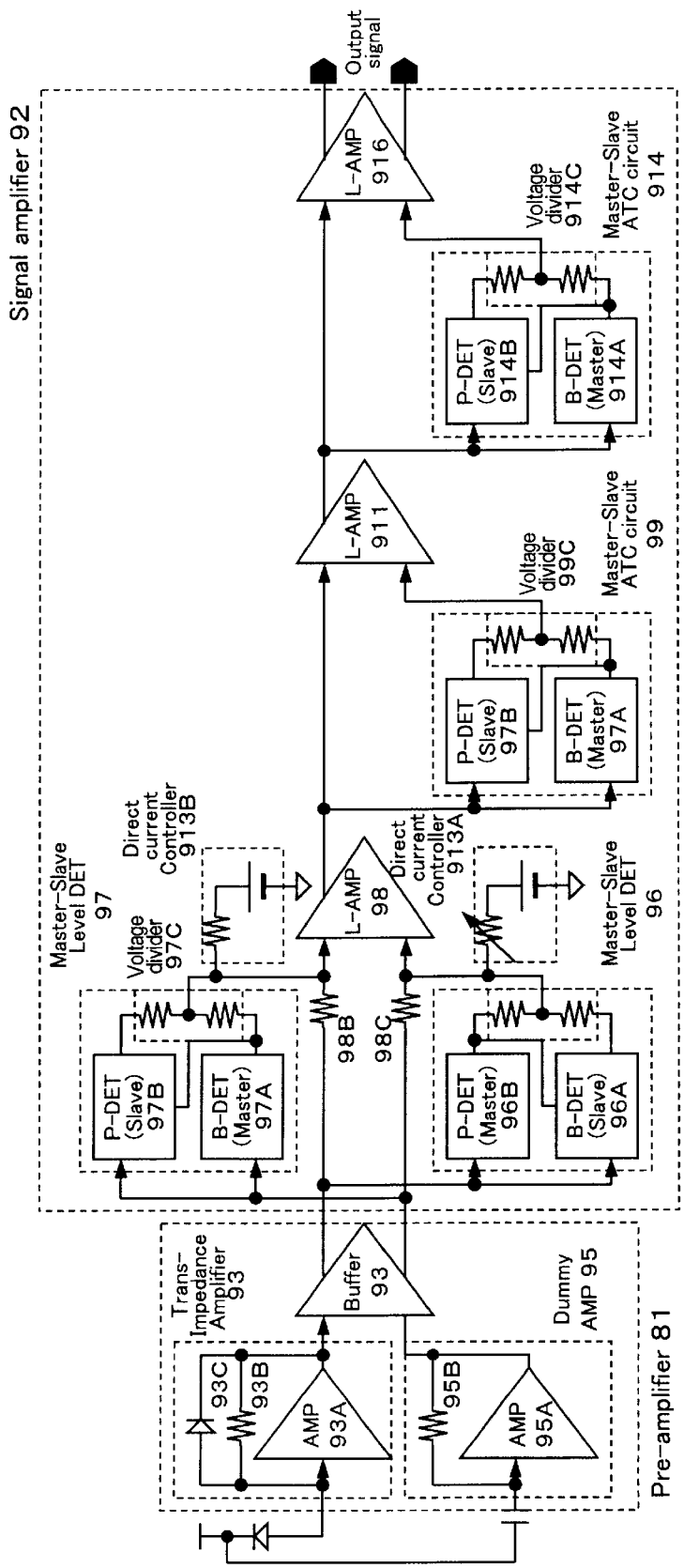
FIG. 26 shows an exemplary configuration diagram of the optical signal receiver according to a ninth embodiment of the present invention.

FIG. 26 shows a configuration diagram of the optical signal receiver according to a ninth embodiment of the present invention. In this embodiment, ATC circuits having an identical configuration to that shown in FIG. 2 are employed in the amplifiers in both the second stage and the succeeding stages. The configuration can be simplified in a circuit, such as in an IC, having less noise and producing less effect of differentiation.

As mentioned above, according to the present invention, a variety of amplifiers can be used together. Also, in this embodiment, direct current control circuits 913A, 913B are provided in master-slave level detectors 96, 97, respectively. Such a configuration enables to control the normal phase input signal and the inverse phase input signal respectively to operate at proper operating points.

Further, it is also possible to adjuste the offset by regulating a resistance value of either one side of direct current control circuits 913A, 913B.

Industrial Applicability

As the present invention has been described according to the accompanied drawings, differential signal transmission is enabled by employing a first master-slave level detector for detecting the DC level of a normal phase signal and a second master-slave level detector for detecting the DC level of an inverse phase signal, and by adding the aforementioned output of the first and second master-slave level detectors to the inverse signal component and the normal signal component, respectively.

It becomes possible to obtain a signal amplifier capable of coping with various transient responses which may occur at the top of a burst cell, sufficiently protected against the disturbance by external noises.

Further, as an input signal to such a signal amplifier, there is applied the signal being converted to a voltage signal by a pre-amplifier, in which the voltage signal has been converted from a current signal by a optical signal detector. An optical signal receiver suitable to receive a burst optical signal can be obtained.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A signal amplifier comprising:
    a first level detector for detecting a direct voltage level of a normal phase signal;
    a first adder for adding an inverse phase signal to a detection output of said first level detector;
    a second level detector for detecting a direct voltage level of said inverse phase signal;
    a second adder for adding said normal phase signal to a detection output of said second level detector; and
    a differential amplifier for differential-amplifying outputs of said first adder and said second adder,
    wherein said first level detector includes:
        a first peak detector for detecting the maximum value of said normal phase signal,
        a first bottom detector for detecting a relatively minimum value of said normal phase signal referenced from a detection level of said first peak detector, and
        a first voltage divider for dividing the voltages between detection outputs of said first peak detector and said first bottom detector; and
    wherein said second level detector includes:
        a second bottom detector for detecting the minimum value of said inverse phase signal,
        a second peak detector for detecting a relatively maximum value of said inverse phase signal referenced from a detection level of said second bottom detector, and
        a second voltage divider for dividing the voltages between detection outputs of said second bottom detector and said second peak detector.

2. The signal amplifier according to claim 1, wherein said second level detector includes a hold capacitor for detecting a bottom value, and one end of said capacitor is connected to the output port of said first level detector.

3. The signal amplifier according to claim 1 further comprising an offset adjustment circuit being connected to the output port of said first level detector.

4. A signal amplifier comprising:
    a level detector for detecting a direct voltage level of either a normal phase signal or an inverse phase signal;
    a first adder for adding either said inverse phase signal or said normal phase signal to a detection output of said level detector;
    a second adder for adding said normal phase signal to said inverse phase signal; and
    a differential amplifier for differential-amplifying outputs of said first adder and said second adder,
    wherein said level detector includes:
        a peak detector for detecting the maximum value of either said inverse phase signal or said normal phase signal, a first bottom detector for detecting a relatively minimum value of either said inverse phase signal or said normal phase signal referenced from a detection level of said peak detector, and a voltage divider for dividing the voltages between detection outputs of said peak detector and said first bottom detector.

5. The signal amplifier according to claim 4, wherein said level detector includes a hold capacitor for detecting a bottom value, and one end of said capacitor is connected to the output port of said level detector.

6. The signal amplifier according to claim 4, further comprising:

an offset adjustment circuit being connected to the output port of said level detector.

7. A signal amplifier comprising:

a first level detector for detecting a direct voltage level of a normal phase signal;

a first adder for adding an inverse phase signal to a detection output of said first level detector;

a second level detector for detecting a direct voltage level of said inverse phase signal;

a second adder for adding said normal phase signal to a detection output of said second level detector; and a differential amplifier for differential-amplifying outputs of said first adder and said second adder, wherein said first level detector includes:
  a first peak detector for detecting the maximum value of said normal phase signal;
  a first voltage divider for dividing the voltages between an output of said first peak detector and said normal phase signal; and
  a first bottom detector for obtaining a relatively minimum value of a voltage division signal from said first voltage divider being referenced from the output of said first peak detector; and wherein the second level detector includes:
  a second bottom detector for detecting the minimum value of said inverse phase signal;
  a second voltage divider for dividing the voltages between an output of said second bottom detector and said normal phase signal; and
  a second peak detector for obtaining a relatively maximum value of the voltage division signal from said second voltage divider being referenced from the output of said second peak detector.

8. The signal amplifier according to claim 7 wherein said second level detector comprises a hold capacitor for detecting a bottom value, and one end of said capacitor is connected to the output port of said first level detector.

9. A signal amplifier comprising:

a level detector for detecting a direct voltage level of either a normal phase signal or an inverse phase signal;

a first adder for adding either said inverse phase signal or said normal phase signal to a detection output of said level detector;

a second adder for adding said normal phase signal to said inverse phase signal; and a differential amplifier for differential-amplifying outputs of said first adder and said second adder, wherein said level detector includes:
  a bottom detector for detecting the minimum value of said inverse phase signal;
  a voltage divider for dividing the voltages between an output of said bottom detector and said normal phase signal; and a peak detector for obtaining a relatively maximum value of the voltage division signal from said voltage divider being referenced from the output of said peak detector.

10. A signal amplifier comprising:

a first level detector for detecting a direct voltage level of a normal phase signal;

a first adder for adding an inverse phase signal to a detection output of said first level detector;

a second level detector for detecting a direct voltage level of said inverse phase signal;

a second adder for adding said normal phase signal to a detection output of said second level detector; and a different amplifier for differential-amplifying outputs of said first adder and said second adder, wherein each of said first level detector and said second level detector includes:
  a peak detector for detecting the maximum value of an input signal;
  a bottom detector for detecting the minimum value of said input signal; and
  a voltage divider for dividing the voltages between the outputs of said peak detector and said bottom detector.

11. The signal amplifier according to claim 10, wherein said second level detector includes a hold capacitor for detecting a bottom value, and one end of said capacitor is connected to the output port of said first level detector.

12. A signal amplifier having a plurality of amplifiers configured with a multi-stage cascade connection, wherein an amplifier in at least one stage among said plurality of amplifier stages comprises:

a first level detector for detecting a direct voltage level of a normal phase signal;

a first adder for adding an inverse phase signal to a detection output of said first level detector;

a second level detector for detecting a direct voltage level of said inverse phase signal;

a second adder for adding said normal phase signal to a detection output of said second level detector; and a differential amplifier for differential-amplifying outputs of said first adder and said second adder, wherein said first level detector includes:
  a first peak detector for detecting the maximum value of said normal phase signal,
  a first bottom detector for detecting a relatively minimum value of said normal phase signal referenced from a detection level of said first peak detector, and
  a first voltage divider for dividing the voltages between detection outputs of said first peak detector and said first bottom detector; and wherein said second level detector includes:
  a second bottom detector for detecting the minimum value of said inverse phase signal,
  a second peak detector for detecting a relatively maximum value of said inverse phase signal referenced from a detection level of said second bottom detector, and
  a second voltage divider for dividing the voltages between detection outputs of said second bottom detector and said second peak detector.

13. The signal amplifier according to claim 12 wherein said differential amplifier comprises:

an AGC amplifier; and a gain control circuit for feedforward-controlling the gain according to input amplitude.

14. The signal amplifier according to claim 12 further comprising:
an offset adjustment circuit being connected to the output port of said first level detector.

15. A signal amplifier having a plurality of amplifiers configured with a multi-stage cascade connection, wherein an amplifier in at least one stage among said plurality of amplifier stages comprises:
a level detector for detecting a direct voltage level of either a normal phase signal or an inverse phase signal;
a first adder for adding either said inverse phase signal or said normal phase signal to a detection output of said level detector;
a second adder for adding said normal phase signal to said inverse phase signal; and
a differential amplifier for differential-amplifying outputs of said first adder and said second adder,
wherein said level detector includes:
a peak detector for detecting the maximum value of either of said inverse phase signal or said normal phase signal,
a first bottom detector for detecting a relatively minimum value of either said inverse phase signal or said normal phase signal referenced from a detection level of said peak detector, and
a voltage divider for dividing the voltages between detection outputs of said peak detector and said first bottom detector.

16. The signal amplifier according to claim 15, wherein said differential amplifier comprises:
an AGC amplifier; and
a gain control circuit for feedforward-controlling the gain according to input amplitude.

17. An optical signal receiver comprising:
an optical signal detector;
a pre-amplifier for converting a voltage signal having been converted by said optical signal detector to a corresponding voltage signal to amplify; and
a signal amplifier to which a normal phase signal and an inverse phase signal being output from said pre-amplifier are input,
wherein said signal amplifier includes:
a first level detector for detecting a direct voltage level of a normal phase signal;
a first adder for adding an inverse phase signal to a detection output of said first level detector;
a second level detector for detecting a direct voltage level of said inverse phase signal;
a second adder for adding said normal phase signal to a detection output of said second level detector; and
a differential amplifier for differential-amplifying outputs of said first adder and said second adder,
wherein said first level detector includes:
a first peak detector for detecting the maximum value of said normal phase signal,
a first bottom detector for detecting a relatively minimum value of said normal phase signal referenced from a detection level of said first peak detector, and
a first voltage divider for dividing the voltages between detection outputs of said first peak detector and said first bottom detector; and
wherein said second level detector includes:
a second bottom detector for detecting the minimum value of said inverse phase signal,
a second peak detector for detecting a relatively maximum value of said inverse phase signal referenced from a detection level of said second bottom detector, and
a second voltage divider for dividing the voltage between detection outputs of said second bottom detector and said second peak detector.

18. An optical signal receiver comprising:
a light receiving element;
a pre-amplifier for converting a voltage signal having been converted by said light receiving element to a corresponding voltage signal to amplify; and
a signal amplifier to which a normal phase signal and an inverse phase signal being output from said pre-amplifier are input,
wherein said signal amplifier includes:
a level detector for detecting a direct voltage level of either a normal phase signal or an inverse phase signal;
a first adder for adding either said inverse phase signal or said normal phase signal to a detection output of said level detector;
a second adder for adding said normal phase signal to said inverse phase signal; and
a differential amplifier for differential-amplifying outputs of said first adder and said second adder,
wherein said level detector includes:
a peak detector for detecting the maximum value of either said inverse phase signal or said normal phase signal,
a first bottom detector for detecting a relatively minimum value of either said inverse phase signal or said normal phase signal referenced from a detection level of said peak detector, and
a voltage divider for dividing the voltages between detection outputs of said peak detector and said first bottom detector.

* * * * *